US012736597B2

(12) United States Patent
Klebanov et al.

(10) Patent No.: US 12,736,597 B2
(45) Date of Patent: Sep. 15, 2026

(54) MAGNETIC SENSOR HAVING SENSING ELEMENTS ON SLOPED SUBSTRATE

(71) Applicant: Allegro MicroSystems, LLC, Manchester, NH (US)

(72) Inventors: Maxim Klebanov, Palm Coast, FL (US); Paolo Campiglio, Arcueil (FR); Yen Ting Liu, Hsinchu (TW); Samridh Jaiswal, London (GB); Yu Chun Huang, Zhubei (TW); William P. Taylor, Amherst, NH (US); Harianto Wong, Southborough, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 149 days.

(21) Appl. No.: 18/817,513

(22) Filed: Aug. 28, 2024

(65) Prior Publication Data

US 2026/0063733 A1 Mar. 5, 2026

(51) Int. Cl.

| | |
|---|---|
| ***G01R 33/00*** | (2006.01) |
| ***G01R 33/02*** | (2006.01) |
| ***G01R 33/07*** | (2006.01) |
| ***G01R 33/09*** | (2006.01) |

(52) U.S. Cl.

CPC ..... *G01R 33/0005* (2013.01); *G01R 33/0023* (2013.01); *G01R 33/0047* (2013.01); *G01R 33/0206* (2013.01); *G01R 33/072* (2013.01); *G01R 33/098* (2013.01)

(58) Field of Classification Search

CPC ............ G01R 33/0005; G01R 33/0023; G01R 33/0047; G01R 33/0206; G01R 33/072; G01R 33/098; G01R 33/093

USPC .......................................................... 324/200

See application file for complete search history.

(56) References Cited

U.S. PATENT DOCUMENTS

| | | | | |
|---|---|---|---|---|
| 5,592,058 | A | 1/1997 | Archer et al. | |
| 6,373,307 | B1 | 4/2002 | Takai | |
| 7,126,330 | B2 * | 10/2006 | Peczalski | G01R 33/0206 324/252 |
| 7,772,838 | B2 | 8/2010 | Bailey et al. | |
| 8,280,568 | B2 | 10/2012 | Nakatsu et al. | |

(Continued)

FOREIGN PATENT DOCUMENTS

| | | |
|---|---|---|
| CN | 105634361 A | 6/2016 |
| EP | 0 848 489 A2 | 6/1998 |

(Continued)

OTHER PUBLICATIONS

U.S. Appl. No. 17/097,533, filed Nov. 13, 2020, Gillet, et al.

(Continued)

*Primary Examiner* — Christopher P Mcandrew

(74) *Attorney, Agent, or Firm* — DALY, CROWLEY, MOFFORD & DURKEE, LLP

(57) ABSTRACT

Methods and apparatus for a magnetic sensor having a substrate with a major surface and opposing sloped surfaces and magnetoresistive (MR) magnetic field sensing elements coupled in a bridge configuration. At least some of the magnetic field sensing elements are located on the sloped surfaces. In embodiments, the sensor comprises a 3D magnetometer. In some embodiments, the bridge configuration comprises an x-axis bridge, a y-axis bridge, and a z-axis bridge.

34 Claims, 22 Drawing Sheets

(56) References Cited

U.S. PATENT DOCUMENTS

| | | | |
|---|---|---|---|
| 8,453,518 B2 | 6/2013 | Diekmann et al. | |
| 8,652,856 B2 | 2/2014 | Nozieres et al. | |
| 8,917,043 B2 | 12/2014 | Reynolds et al. | |
| 8,917,044 B2 | 12/2014 | Reynolds et al. | |
| 9,194,884 B1 | 11/2015 | Mossman et al. | |
| 9,329,057 B2 | 5/2016 | Foletto et al. | |
| 9,411,023 B2 | 8/2016 | Friedrich et al. | |
| 9,733,316 B2 * | 8/2017 | Lei | G01R 33/0005 |
| 9,780,706 B2 | 10/2017 | Allegrini et al. | |
| 9,983,045 B2 | 5/2018 | O'Neill | |
| 10,330,499 B2 | 6/2019 | Elliott et al. | |
| 10,380,879 B2 | 8/2019 | Haas et al. | |
| 10,580,289 B2 | 3/2020 | Haas et al. | |
| 10,636,285 B2 | 4/2020 | Haas et al. | |
| 10,692,362 B2 | 6/2020 | Petrie et al. | |
| 10,705,560 B1 | 7/2020 | Petrie et al. | |
| 10,816,366 B2 | 10/2020 | Weiland et al. | |
| 10,866,122 B2 | 12/2020 | Weiland et al. | |
| 11,079,291 B2 | 8/2021 | Bertin | |
| 11,112,275 B2 | 9/2021 | Bertin | |
| 11,303,257 B2 | 4/2022 | Daubert et al. | |
| 11,326,903 B1 | 5/2022 | Casu et al. | |
| 11,408,755 B2 | 8/2022 | Bertin | |
| 2003/0001537 A1 | 1/2003 | Yang et al. | |
| 2003/0070126 A1 | 4/2003 | Werner et al. | |
| 2003/0127289 A1 | 7/2003 | Elgas et al. | |
| 2004/0232862 A1 | 11/2004 | Wogari et al. | |
| 2005/0007044 A1 | 1/2005 | Qiu et al. | |
| 2005/0270020 A1 * | 12/2005 | Peczalski | G01R 33/0206 324/252 |
| 2006/0171081 A1 * | 8/2006 | Brcuer | G01R 33/0206 |
| 2006/0195720 A1 | 8/2006 | Watts | |
| 2007/0001629 A1 | 1/2007 | McGarry et al. | |
| 2009/0027048 A1 * | 1/2009 | Sato | G01R 33/09 29/602.1 |
| 2009/0254300 A1 | 10/2009 | Schneider et al. | |
| 2009/0315544 A1 | 12/2009 | Takahashi et al. | |
| 2011/0062909 A1 | 3/2011 | Patel et al. | |
| 2012/0074972 A1 | 3/2012 | Rasbornig et al. | |
| 2012/0211299 A1 | 8/2012 | Yanai | |
| 2013/0106340 A1 | 5/2013 | Chabaud et al. | |
| 2013/0154538 A1 | 6/2013 | Ogawa | |
| 2013/0200909 A1 | 8/2013 | Rasbornig et al. | |
| 2013/0249544 A1 | 9/2013 | Vig et al. | |
| 2014/0028237 A1 | 1/2014 | Park et al. | |
| 2014/0184200 A1 | 7/2014 | Milano et al. | |
| 2014/0285124 A1 | 9/2014 | Derammelaere et al. | |
| 2014/0333241 A1 | 11/2014 | Zhao et al. | |
| 2015/0015241 A1 | 1/2015 | Tamura | |
| 2015/0185279 A1 | 7/2015 | Milano et al. | |
| 2015/0185284 A1 | 7/2015 | Milano et al. | |
| 2015/0185293 A1 | 7/2015 | Milano et al. | |
| 2015/0241523 A1 | 8/2015 | Scherr | |
| 2015/0285873 A1 * | 10/2015 | Cai | G01R 33/0206 324/252 |
| 2015/0309125 A1 * | 10/2015 | Huang | G01R 33/0052 216/22 |
| 2015/0354985 A1 | 12/2015 | Judkins, III et al. | |
| 2016/0025820 A1 | 1/2016 | Scheller et al. | |
| 2016/0139199 A1 | 5/2016 | Petrie et al. | |
| 2016/0139229 A1 | 5/2016 | Petrie et al. | |
| 2017/0052208 A1 | 2/2017 | Reddy et al. | |
| 2017/0110652 A1 | 4/2017 | Doogue et al. | |
| 2017/0322052 A1 * | 11/2017 | Paul | G01R 33/0005 |
| 2017/0346420 A1 | 11/2017 | Ross et al. | |
| 2018/0113179 A1 * | 4/2018 | Deak | G01R 31/2829 |
| 2018/0138841 A1 | 5/2018 | Campbell et al. | |
| 2018/0214509 A1 | 8/2018 | Desriac et al. | |
| 2018/0367073 A1 | 12/2018 | Haas | |
| 2019/0368858 A1 * | 12/2019 | Deak | H10N 50/10 |
| 2021/0148734 A1 | 5/2021 | Foletto | |
| 2022/0003572 A1 | 1/2022 | Stewart | |
| 2022/0128382 A1 | 4/2022 | Drouin | |
| 2023/0332965 A1 | 10/2023 | Casu et al. | |

FOREIGN PATENT DOCUMENTS

| | | |
|---|---|---|
| JP | H 03231317 A | 10/1991 |
| JP | 2006/067667 A | 3/2006 |
| JP | 2010/045914 A | 2/2010 |
| KR | 101394556 B1 | 5/2014 |

OTHER PUBLICATIONS

U.S. Appl. No. 17/120,395, filed Dec. 14, 2020, Casu, et al.

U.S. Appl. No. 17/651,265, filed Feb. 16, 2022, Ostermann, et al.

Allegro MicroSystems, LLC, "Position Sensor IC with Speed and Direction Output;" ATS696PSM Data Sheet; Oct. 7, 2021; 14 Pages.

Emadi, "Advanced Electric Drive Vehicles", pp. 210-211 from Book; Jan. 2015, 4 Pages.

International Standard Organization (ISO), "Road Vehicles—Functional Safety—Part 1: Vocabulary", ISO 26262-1; First Edition; Nov. 15, 2011, 30 Pages.

International Standard Organization (ISO), "Road Vehicles—Functional Safety—Part 5: Product Development at the Hardware Level;" ISO 26262-5; Nov. 15, 2011; 86 Pages.

International Standard Organization (ISO), "Road Vehicles—Functional Safety—Part 9: Automotive Safety Integrity Level (ASIL)-Oriented and Safety-Oriented Analyses;" ISO 26262-9; Nov. 15, 2011; 24 Pages.

Microchip WebSeminars, "Sensorless Field Oriented Control (FOC) for Permanent Magnet Synchronous Motors (PMSM);" Web Seminar; Jan. 2007; 51 Pages.

Ruggeri et al., "3D Hall-Effect Magnetometer Using a Single Inverted Pyramid Structure;" Proceedings from the 37th IEEE International Conference on Micro Electro Mechanical Systems (IEEE MEMS 2024); Jan. 21-25, 2024; 4 Pages.

* cited by examiner 1000
1002
1000

1004
1002
1000

1006
1010a
1008
1002
1010b 1010a
1008
1002
1010b 1012
1010a
1002
1010b 1018
1016
1014
1012
1010a
1002
1010b 1028
1028
1012
1002
1028
1028
1012
1002
1026
1024
1002
1030
1012
1012
1002
1032
1032
1032
1030
1012
1002
1032
1032
1032
1030
1024
1024
1002

1030
1036
1036
1002
1024
1038
1030
1034
1024
1002
1034
1030
1012
1002
1030
1034
1002
1030
1024
1012
1002
1030
1036
1034
1012
1002

1218
1204
1206
1210
1228
1218
1204
1206
1220
1218
1204
1206
1210
1224
1218
1226
1204
1206
1224
1220
1218
1216
1214
1212
1210
1204
1206
1222
1218
1216
1214
1212
1204
1206

MAGNETIC SENSOR HAVING SENSING ELEMENTS ON SLOPED SUBSTRATE

BACKGROUND

As is known in the art, magnetic field sensors are often used to detect a ferromagnetic target. They often act as sensors to detect motion or position of the target. Such sensors are ubiquitous in many areas of technology including robotics, automotive, manufacturing, etc. For example, a magnetic field sensor may be used to detect when a vehicle's wheel locks up, triggering the vehicle's control processor to engage the anti-lock braking system. In this example, the magnetic field sensor may detect rotation of the wheel. Magnetic field sensors may also detect distance between the magnetic field sensor and an object. Sensors such as these may be used to detect the proximity of the object as it moves toward and away from the magnetic field sensor.

SUMMARY

Example embodiments of the disclosure provide methods and apparatus for a magnetic field sensor having magnetic field sensing elements located on sloped surfaces of a substrate. In embodiments, the sensing elements can be placed to provide a 3D magnetometer. In some embodiments, magnetoresistive (MR) sensing elements can have reference layer orientations to provide desired response characteristics, such as in-plane or out-of-plane immunity, and/or sensitivity to fields having certain orientations.

In one aspect, a sensor comprises: a substrate having a major surface and opposing sloped surfaces; and magnetoresistive (MR) magnetic field sensing elements coupled in a bridge configuration, wherein at least some of the magnetic field sensing elements are located on the sloped surfaces.

A sensor can further include one or more of the following features: the sensor comprises a 3D magnetometer, the bridge configuration comprises an x-axis bridge, a y-axis bridge, and a z-axis bridge, the x-axis bridge includes a first pair of bridge elements on a first one of the opposing sloped surfaces and a second pair of bridge elements on a second one of the opposing sloped surfaces for sensitivity in the x-axis, the first and second opposing sloped surfaces have opposite slope angles, the y-axis bridge includes a third pair of bridge elements on a third one of the opposing sloped surfaces and a fourth pair of bridge elements on a fourth one of the opposing sloped surfaces for sensitivity in the x-axis, wherein the x-axis and the y-axis are perpendicular to each other, the third and fourth opposing sloped surfaces oppose each other and have opposite slope angles, the z-axis bridge includes at least four bridge elements each located on different ones of the sloped surfaces for sensitivity in the z-axis, further magnetic field sensing elements located on a major surface of the substrate, the further magnetic field sensing elements are configured to calibrate the magnetic field sensing elements on the sloped surfaces, at least some of the magnetic field sensing elements are located at different depths from the major surface of the substrate for detecting field gradients, the at least some of the magnetic field sensing elements located at different depths from the major surface of the substrate are positioned on respective steps formed in the sloped surfaces, first ones of the at least some of the magnetic field sensing elements are located on the sloped surfaces, second ones of the at least some of the magnetic field sensing elements are located on the steps which are parallel to the major surface of the substrate, the magnetic field sensing elements comprise tunnelling magnetoresistive (TMR) elements, Hall elements deposited on at least one of the sloped surfaces, the sloped surfaces having the deposited Hall elements are formed by a v-shaped etch, the sloped surfaces having the deposited Hall elements are extend from a flat bottom surface, and/or the angle of the sloped surfaces having the deposited Hall elements formed by the v-shaped etch corresponds to a crystal lattice angle of the substrate.

In another aspect, a method comprises: manipulating a substrate, which forms part of a sensor, to have a major surface and opposing sloped surfaces; and coupling magnetoresistive (MR) magnetic field sensing elements in a bridge configuration, wherein at least some of the magnetic field sensing elements are located on the sloped surfaces.

A method can further include one or more of the following features: the sensor comprises a 3D magnetometer, the bridge configuration comprises an x-axis bridge, a y-axis bridge, and a z-axis bridge, the x-axis bridge includes a first pair of bridge elements on a first one of the opposing sloped surfaces and a second pair of bridge elements on a second one of the opposing sloped surfaces for sensitivity in the x-axis, the first and second opposing sloped surfaces have opposite slope angles, the y-axis bridge includes a third pair of bridge elements on a third one of the opposing sloped surfaces and a fourth pair of bridge elements on a fourth one of the opposing sloped surfaces for sensitivity in the x-axis, wherein the x-axis and the y-axis are perpendicular to each other, the third and fourth opposing sloped surfaces oppose each other and have opposite slope angles, the z-axis bridge includes at least four bridge elements each located on different ones of the sloped surfaces for sensitivity in the z-axis, further magnetic field sensing elements located on a major surface of the substrate, the further magnetic field sensing elements are configured to calibrate the magnetic field sensing elements on the sloped surfaces, at least some of the magnetic field sensing elements are located at different depths from the major surface of the substrate for detecting field gradients, the at least some of the magnetic field sensing elements located at different depths from the major surface of the substrate are positioned on respective steps formed in the sloped surfaces, first ones of the at least some of the magnetic field sensing elements are located on the sloped surfaces, second ones of the at least some of the magnetic field sensing elements are located on the steps which are parallel to the major surface of the substrate, the magnetic field sensing elements comprise tunnelling magnetoresistive (TMR) elements, Hall elements deposited on at least one of the sloped surfaces, the sloped surfaces having the deposited Hall elements are formed by a v-shaped etch, the sloped surfaces having the deposited Hall elements are extend from a flat bottom surface, and/or the angle of the sloped surfaces having the deposited Hall elements formed by the v-shaped etch corresponds to a crystal lattice angle of the substrate.

BRIEF DESCRIPTION OF THE DRAWINGS

The foregoing features of this disclosure, as well as the disclosure itself, may be more fully understood from the following description of the drawings in which.

DETAILED DESCRIPTION

Figure 1:
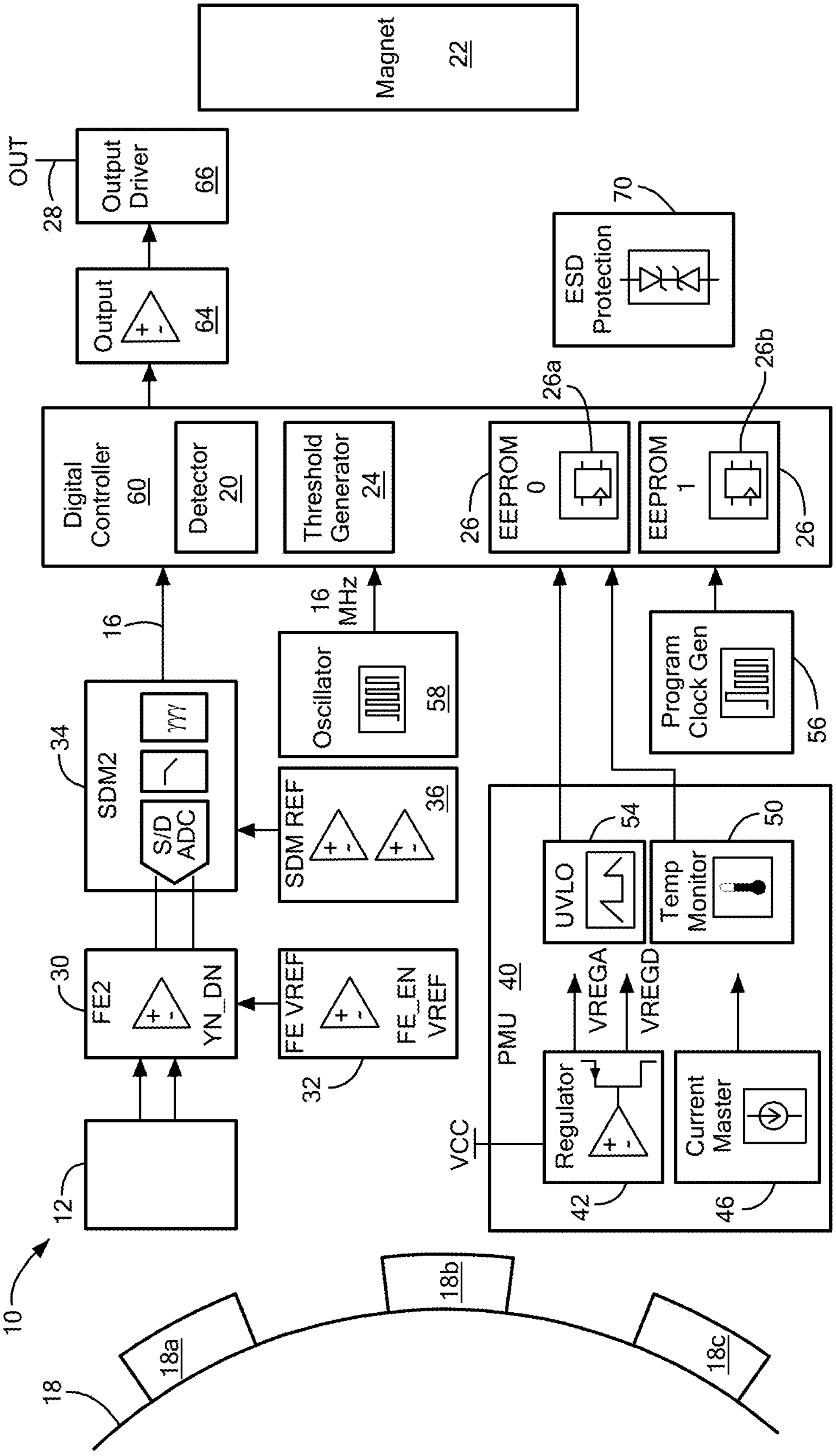
FIG. 1 is a schematic representation of an example sensor having a magnetoresistive (MR) bridge with MR elements on a sloped substrate.

FIG. 1 shows an example magnetic field sensor 10 having at least one magnetic field sensing element 12 that includes one or more MR elements on a sloped substrate. The sensor 10 is configured to generate a magnetic field signal 16 indicative of a magnetic field associated with a target 18 and a detector 20 responsive to the magnetic field signal and to a threshold level from a threshold generator 24 to generate a sensor output signal 28 containing transitions associated with features of the target in response to the magnetic field signal crossing the threshold level.

The target 18 can have a variety of forms, including, but not limited to a gear having gear teeth 18*a* - 18*c* or a ring magnet having one or more pole pair. Also, linear arrangements of ferromagnetic objects that move linearly are possible. In the example embedment of FIG. 1, magnetic field sensor 10 may take the form of a rotation detector to detect passing gear teeth, for example, gear teeth 18*a*-18*c* of a ferromagnetic gear or, more generally target object 18. A permanent magnet 22 can be placed at a variety of positions proximate to the gear 18, resulting in fluctuations of a magnetic field proximate to the gear as the gear rotates in a so-called “back-bias”arrangement.

Features of the target 18 are spaced from the sensing elements 12 by an airgap. Although intended to be fixed once the sensor 10 is in place in a particular application, the airgap can vary for a variety of reasons. A difference between angles of the transitions of the sensor output signal 28 and locations of the associated features 18*a*-18*c* of the target 28 is referred to as a “hard offset.”

Sensing elements 12 can take a variety of forms, such as Hall elements and/or GMR and/or TMR elements, as may be arranged in one or more bridge or other configurations in order to generate one or more single-ended or differential signals indicative of the sensed magnetic field. A front-end amplifier 30 can be used to process the magnetic field sensing element output signal to generate a further signal for coupling to an analog-to-digital converter (ADC) 34 as may include one or more filters, such as a low pass filter and/or notch filter, and as may take the form of a sigma delta modulator to generate a digital magnetic field signal 16. Features of the magnetic field signal processing can include a front-end reference 32 and a sigma delta reference 36.

Sensor 10 includes a power management unit (PMU) 40 as may contain various circuitry to perform power management functions. For example, a regulator 42 can output a regulated voltage for powering analog circuitry of the sensor (VREGA) and/or a regulated voltage for powering digital circuitry of the sensor (VREGD). A bias current source 46, a temperature monitor 50 and an undervoltage lockout 54 can monitor current, temperature, and voltage levels and provide associated status signals to a digital controller 60. A clock generation element 56 and an oscillator 58 are coupled to the digital controller 60.

Digital controller 60 processes the magnetic field signal 16 to determine the speed, position, and/or direction of movement, such as rotation of target 18 and outputs one or more digital signals to an output protocol module 64. More particularly, controller 60 determines the speed, position, and/or direction of target 18 based on the magnetic field signal 16 and can combine this information with fault information in some embodiments to generate the sensor output signal 28 in various formats. The output of module 64 is fed to an output driver 66 that provides the sensor output signal 28 in various formats, such as a so-called two-wire format in which the output signal is provided in the form of current pulses on the power connection to the sensor or a three-wire format in which the output signal is provided at a separate dedicated output connection. Formats of the output signal 28 can include variety of formats, for example a pulse-width modulated (PWM) signal format, a Single Edge Nibble Transmission (SENT) format, a Serial Peripheral Interface (SPI) format, a Local Interconnect Network (LIN) format, a CAN (Controller Area Network) format, an Inter-Integrated Circuit ($I^2C$) format, or other similar signal formats. Sensor 10 can further include electrostatic discharge (ESD) protection 70.

The digital controller 60 includes detector 20, threshold generator 24, and memory 26 such as EEPROMs 26*a*, 26*b*. Memory 26 can be used to store values for various sensor functionality including storing function coefficients for use by the threshold generator 24 in generating the adaptive threshold levels for use by detector 20.

Detector 20 is coupled to receive the threshold level thus generated and the magnetic field signal 16 and compare the received levels to generate a binary, two-state, detector output signal that has transitions when the signal 16 crosses the threshold level. Movement speed of the target 18 can be detected in accordance with the frequency of the binary signal.

It should be appreciated that a direction of rotation of the target 28 may be determined in embodiments containing multiple sensing elements 12 configured to generate phase separated magnetic field signals (as are sometimes referred to as channel signals), in which case the direction of rotation can be determined based on a relative phase or relative time difference (e.g., lag or lead) of a particular edge transition of detector output signals associated with the phase separated magnetic field signals.

It is understood that embodiments of MR-based sensing elements are useful in a wide variety of magnetic sensors. While an example sensor is shown and described above, any practical magnetic sensor in which 3D sensing desirable can be provided. For example, MR sensing elements are useful in many magnetic position and angle sensors that require high resolution. Further example sensors in which MR-based sensing elements are shown and described below.

Figure 2:
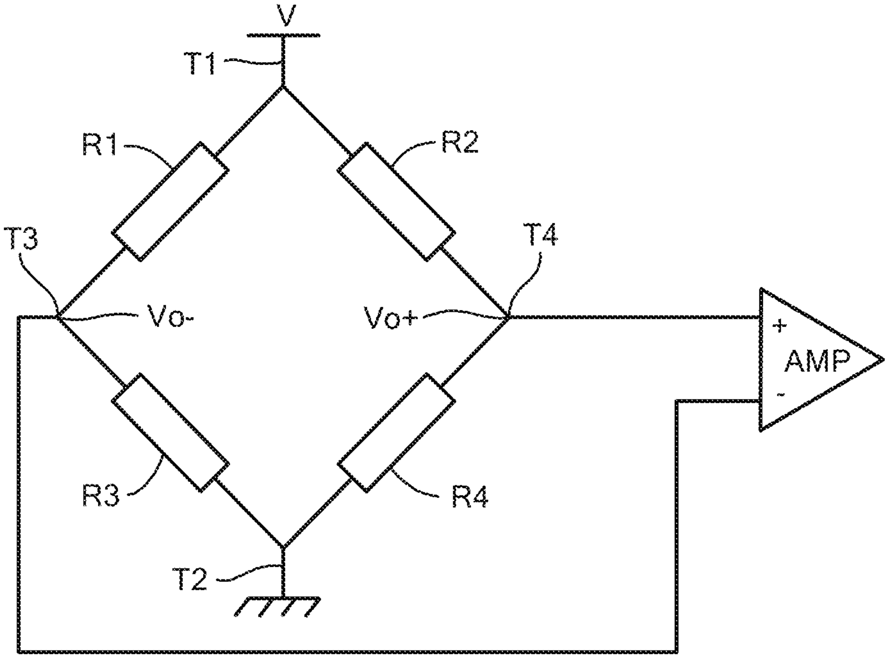
FIG. 2 is schematic representation of a MR bridge.

FIG. 2 shows an example TMR bridge 200 having a first resistor R1, a second resistor R2, a third resistor R3, and fourth resistor R4 coupled in a bridge configuration, which can correspond to the sensing elements 12 of FIG. 1. A first terminal T1 is coupled to a voltage supply and a second terminal T2 is coupled to ground (or other potential). A third terminal T3 provides a first differential output signal Vo− and a fourth terminal T4 provides a second differential output signal Vo+. The differential output Vo+, Vo− of the bridge can be provided to an amplifier AMP or other circuitry for processing of the output of the magnetic field sensing elements, such as described above.

Figure 3A:
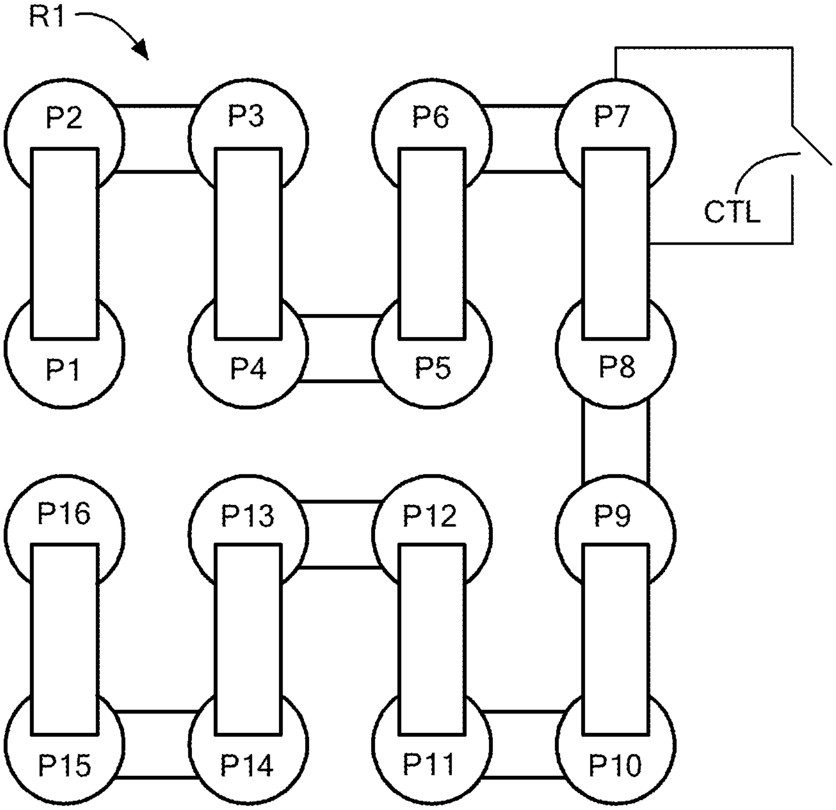
FIG. 3A is a schematic representation of an adjustable bridge resistor having TMR pillars.

FIG. 3A shows an example implementation in which bridge resistor R1 contains sixteen pillars P1-16 that provide the total resistance for R1. In the illustrated embodiment, pillar P7 is connected to a switch SW, which is controlled by a control signal CTL. When the switch SW is closed, the pillar P7 is shorted out, thus reducing the overall resistance of the bridge resistor R1 since the resistance of pillar P7 does not contribute to the overall resistance of R1.

Figure 3B:
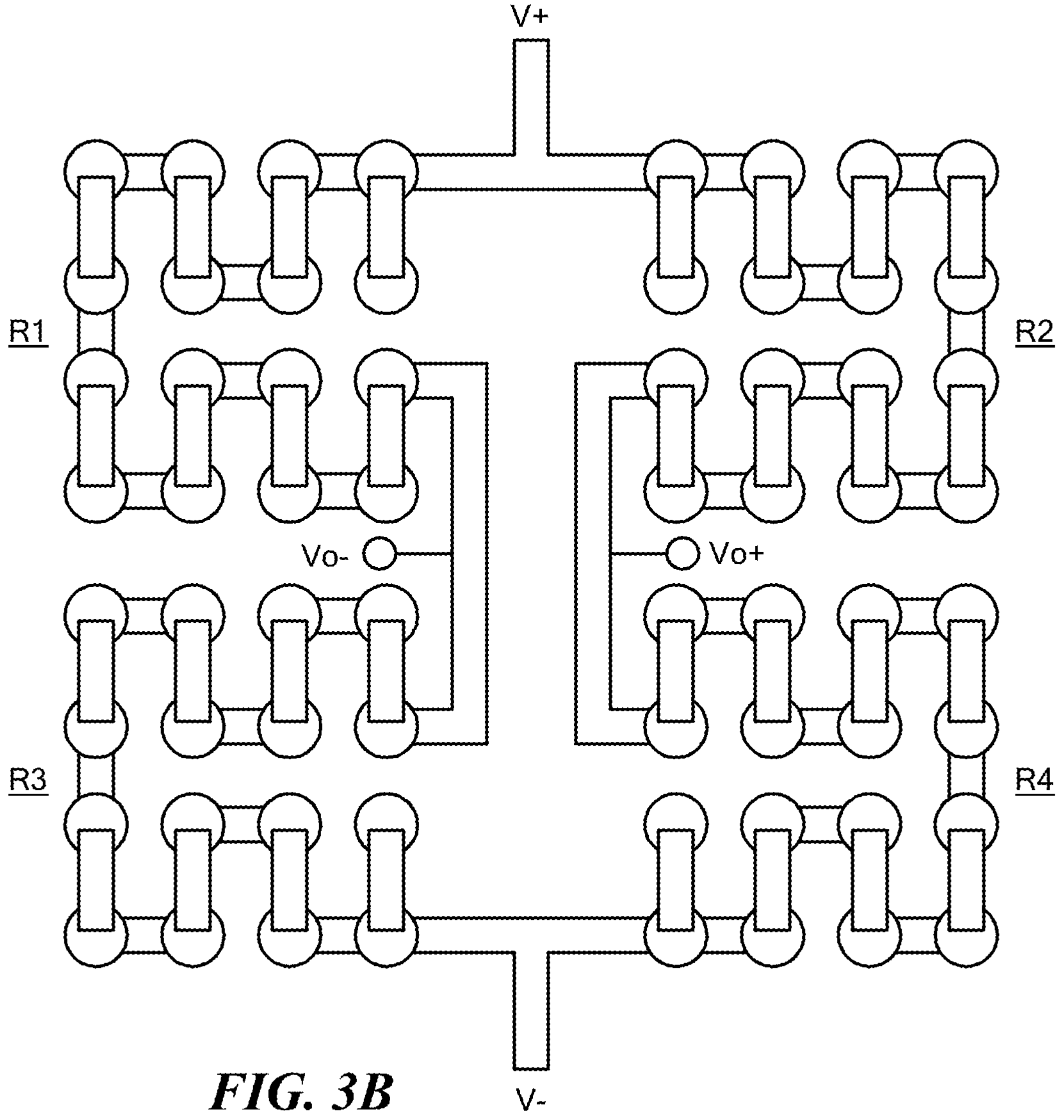
FIG. 3B is a schematic representation of a bridge having resistors provided by TMR pillars.
Figure 3C:
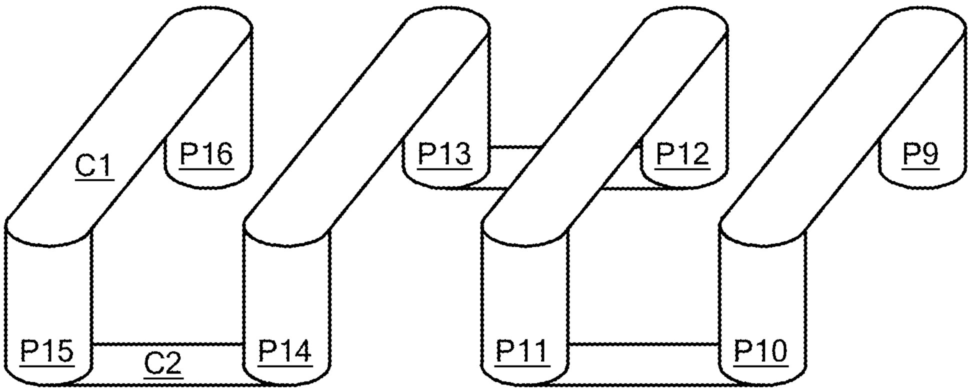
FIG. 3C is a perspective view of a portion of the TMR bridge of FIG. 3A.

FIG. 3B shows an example implementation in which each of the bridge resistors R1, R2, R3, R4 comprises a series of pillars formed from TMR elements. As explained more fully below, by controlling switches coupled to the pillars, e.g., the individual TMR elements, the resistance of each of the bridge resistors R1, R2, R3, R4 can be modified to balance the respective resistances. That is, in embodiments, the resistance of the bridge resistors R1, R2, R3, R4 should be as close to equal as possible. FIG. 3C shows a perspective view of FIG. 3A in which pillars P9-P16 are alternately coupled together at the top and bottom. As can be seen, pillars P15 and P16 are connected at the top by connector C1 and pillars P14 and P15 connected at the bottom by connector C2.

It is understood that a switch can be coupled to one or more pillars in any way to modify the overall resistance of the bridge resistor. As described above, a switch can have an open or closed position to selectively remove the resistance of a pillar by short circuiting the pillar. In other embodiments, a switch can couple a signal, such as a voltage supply signal, ground signal, output signal, etc., to a node adjacent a pillar or between pillars to increase or decrease a total resistance of a bridge resistor, as shown and described more fully below.

It is understood that a TMR resistor that provides a leg of the bridge can comprise any practical number of pillars connected in series and/or in parallel to provide the TMR bridge resistor. As described more fully below, pillars can be designed to have the same or different resistances.

In example embodiments of the disclosure, a magnetic field sensor includes MR elements deposited on sloped areas of a substrate to provide three-dimensional (3D) sensing. Various MR bridge elements can have different orientations in space to provide sensitivity for out-of-plane (OOP), perpendicular to plane, and z-axis. In embodiments, a sensor provides a 3D magnetometer.

Figure 4B:
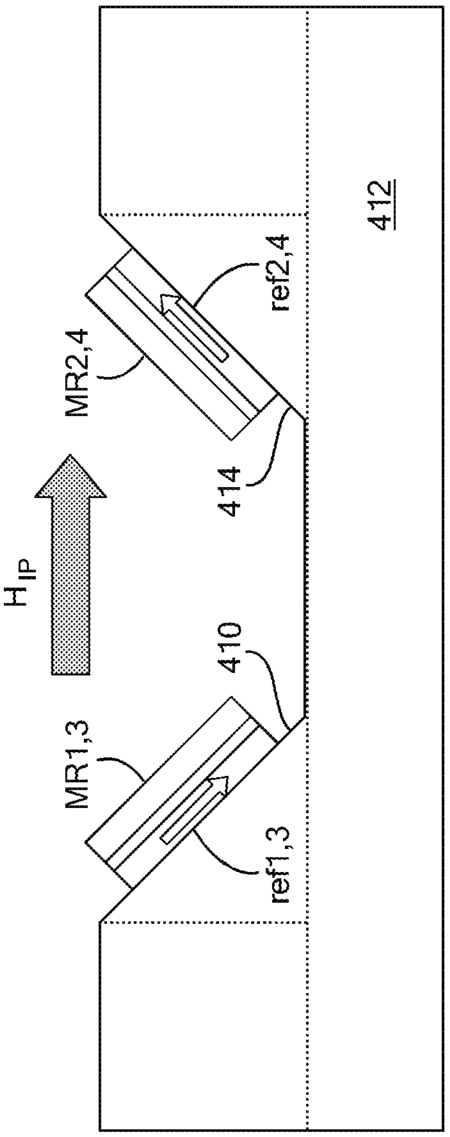
FIG. 4B shows bridge elements on a sloped surfaces of a substrate.
Figure 4C:
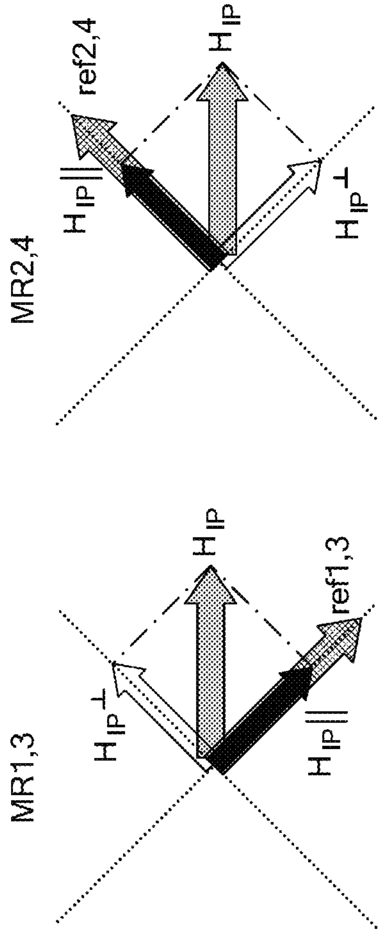
FIG. 4C shows responses of the bridge elements to an in-plane field.
Figure 4A:
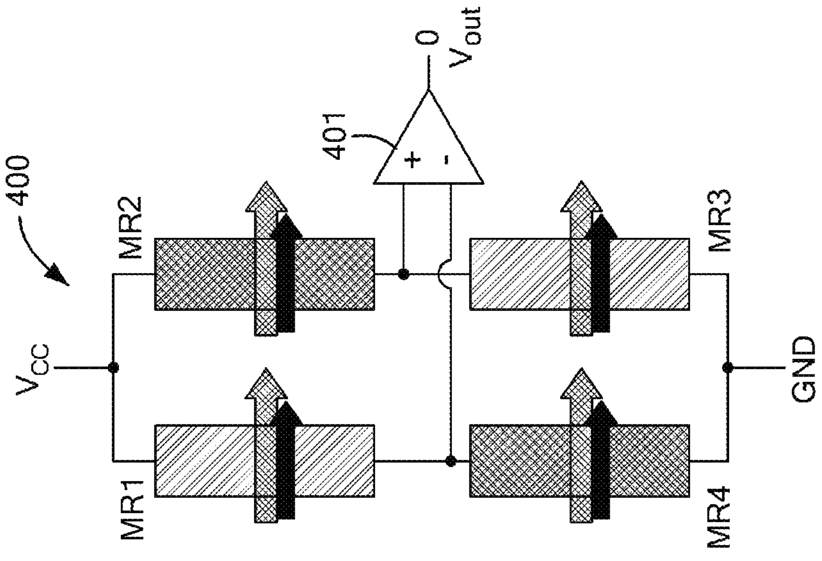
FIG. 4A shows an MR bridge.

FIG. 4A shows an example bridge 400 having MR elements MR1-4 connected in a bridge configuration. An output across the bridge 400 is coupled to an amplifier 401 that generates an output voltage signal Vout, which is shown as zero in the illustrated embodiment. The orientation of the reference layers in the MR elements MR1-4 is indicated by respective arrows. In the illustrated embodiment, each arow is horizontal on the page and pointing to the right. It is understood that the terms horizontal and right are relative terms used to facilitate an understanding of the disclosure and should not be construed as limiting in any way.

FIG. 4B shows MR bridge elements MR1, MR3 positioned on a first sloped surface 410 of a substrate 412 and MR elements MR2, MR4, positioned on a second sloped surface 414 of the substrate. The orientation of the reference layer for each of the MR elements is shown by respective arrows. In the illustrated embodiment, the first and second sloped surfaces 410, 414 are opposite and equal in slope, e.g., the first sloped surface 410 is 45 degrees from the horizontal and the second sloped surface 414 is −45 degrees with respect to the horizontal—the surfaces are perpendicular to each other. In other embodiments, the slopes of the respective surfaces can be different from each other to meet the needs of a particular application.

FIG. 4C shows the response of the MR elements MR1-4 to an in-plane field $H_{IP}$. Assuming a 45 degree orientation of the similarly configured elements, the in-plane field $H_{IP}$ produces equal and opposite responses in pairs of the MR elements MR1-4 in the bridge. As shown, elements MR1, 3 generate a response $H_{IP} \perp$ (perpendicular) that is equal and opposite to response of elements MR2,4 and nets to zero. Similarly, the response $H_{IP} \parallel$ (parallel) is equal and opposite in elements MR1,3 and elements MR2,4. The response of the reference layer responses ref1,3 and ref2,4 are also equal and opposite. The result is the bridge 400 outputs a Vout signal of zero volts. With this arrangement, the bridge 400 is immune to an in-plane field $H_{IP}$. That is, the in-plane field is seen as a common mode signal that is canceled so that the bridge output is zero in the presence of an in-plane field, assuming no other fields are present.

Figure 5A:
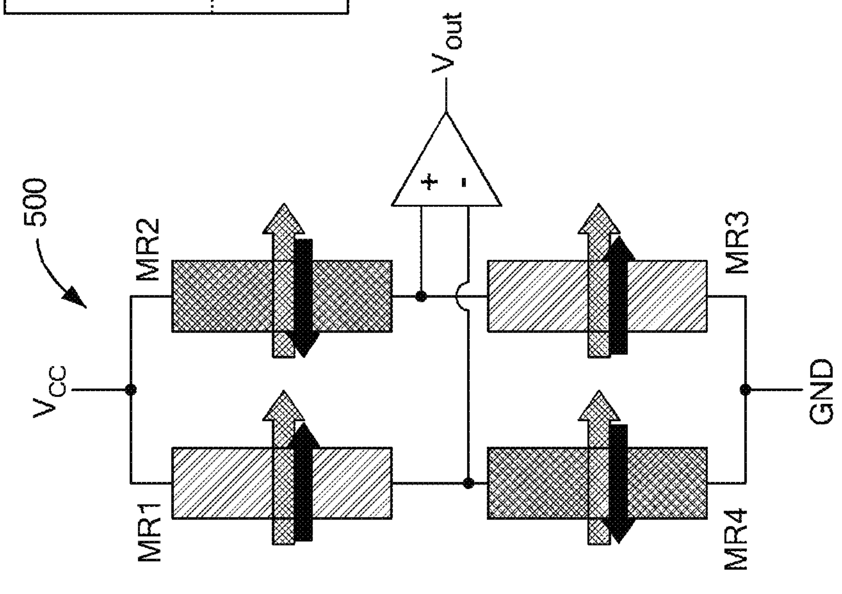
FIG. 5A shows an MR bridge.
Figure 5B:
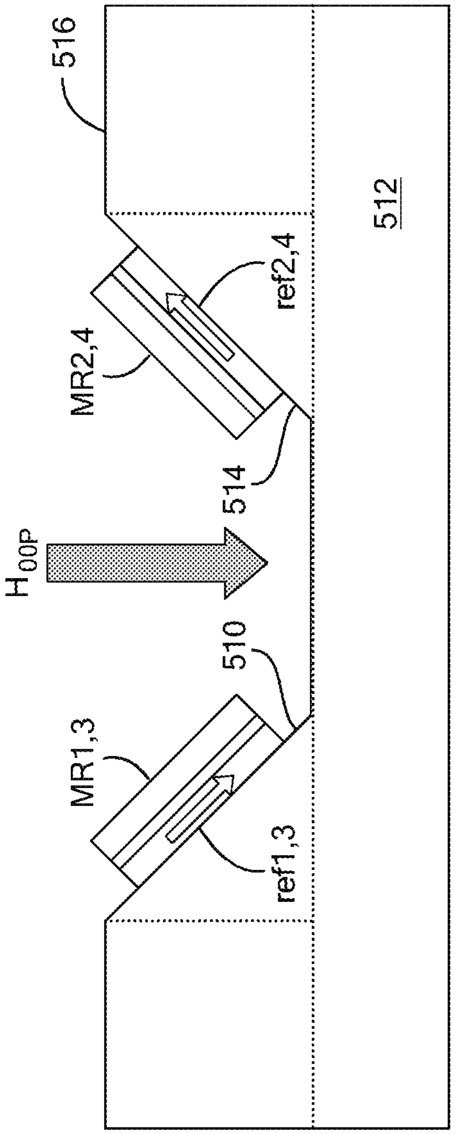
FIG. 5B shows bridge elements on a sloped surfaces of a substrate.
Figure 5C:
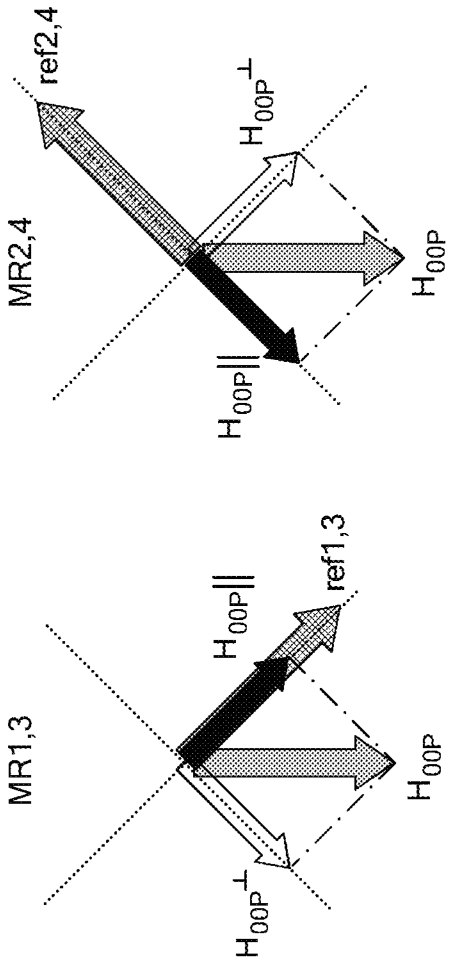
FIG. 5C shows responses of the bridge elements to an out-of-plane field.

FIG. 5A shows an example bridge 500 having elements MR1-4 that are similar to the element of FIG. 4 but with elements MR2, 4 having opposite reference orientations, as indicated by the respective arrows, to provide sensitivity to an out of plane (OOP) field $H_{OOP}$. FIG. 5B shows elements MR1,3 and elements MR2,4 on oppositely sloped surfaces 510, 514 of the substrate 512. The applied field $H_{OOP}$ is perpendicular to the major surface 516 of the substrate. FIG. 5C shows the $H_{OOP} \parallel$ response of elements MR1,3 to be equal and opposite the response of elements MR2,4. Similarly, the $H_{OOP} \perp$ response of elements MR1,3 is equal and opposite to that of the response of elements MR2,4. Due to the opposite direction of the reference layer orientations in the perpendicular direction, ref1,3 and ref2,4 produce a differential output Vout at the output of the bridge due to the sensitivity to an OOP field.

Figure 6B:
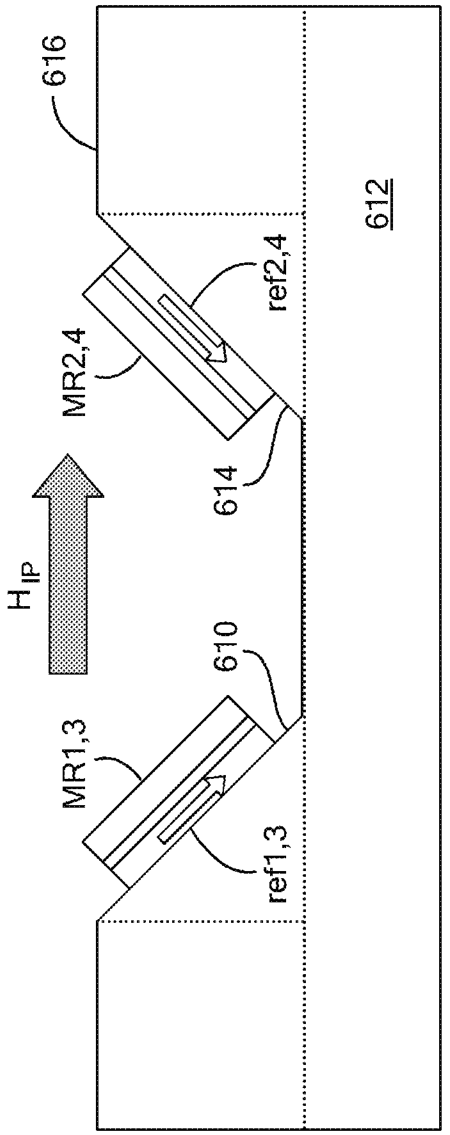
FIG. 6B shows bridge elements on a sloped surfaces of a substrate.
Figure 6C:
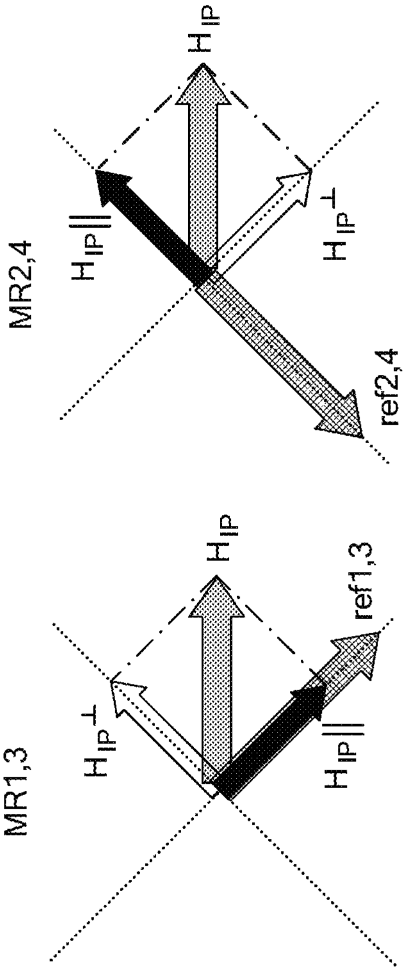
FIG. 6C shows responses of the bridge elements to an in-plane field.
Figure 6A:
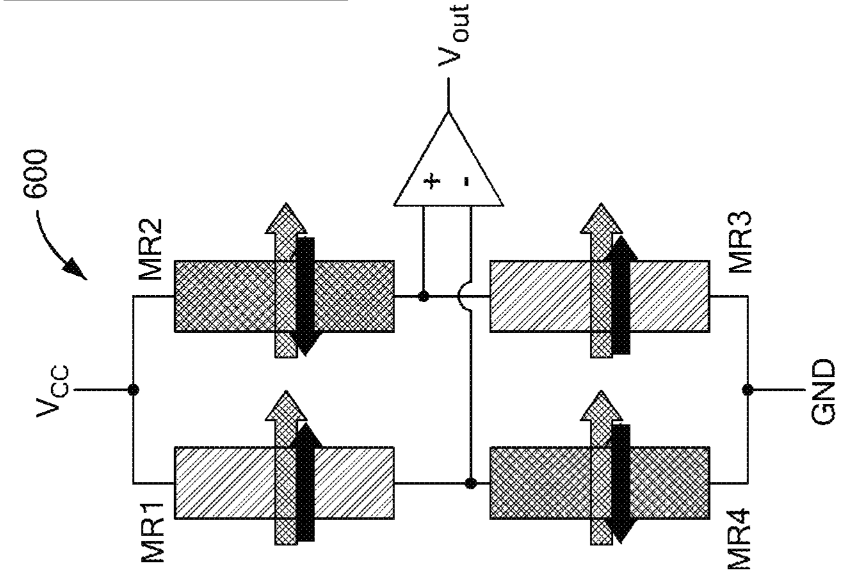
FIG. 6A shows an MR bridge.

FIG. 6A shows an example bridge 600 having elements MR1-4 that are similar to the elements of FIG. 4 but with elements MR2, 4 having opposite reference orientations, as indicated by the respective arrows, to provide sensitivity to an in-plane (IP) field. FIG. 6B shows elements MR1,3 and elements MR2,4 on oppositely sloped surfaces 610, 614 of the substrate 612. The applied field $H_{IP}$ is parallel to the major surface 616 of the substrate. FIG. 6C shows that due to the opposite direction of the reference layer orientations, ref1,3 and ref2,4 produce a differential output Vout at the output of the bridge due to the sensitivity to the IP field.

Figure 7A:
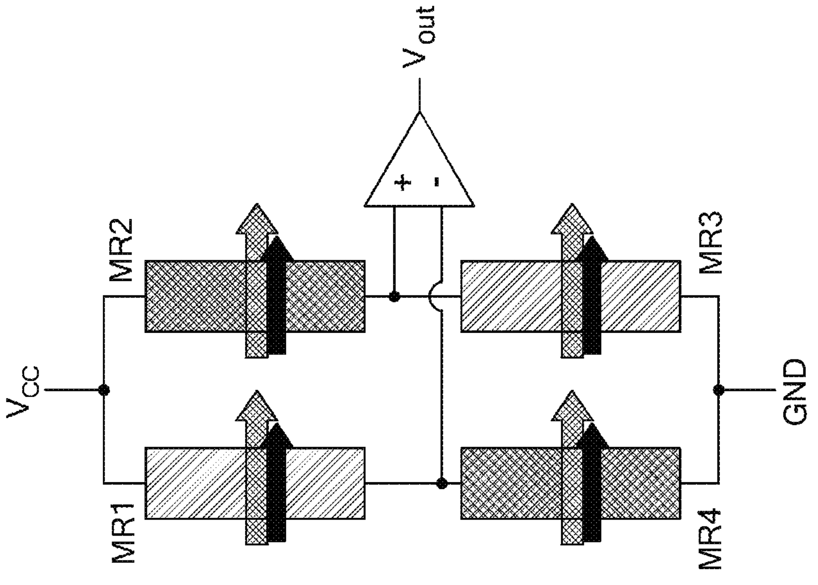
FIG. 7A shows an MR bridge.
Figure 7B:
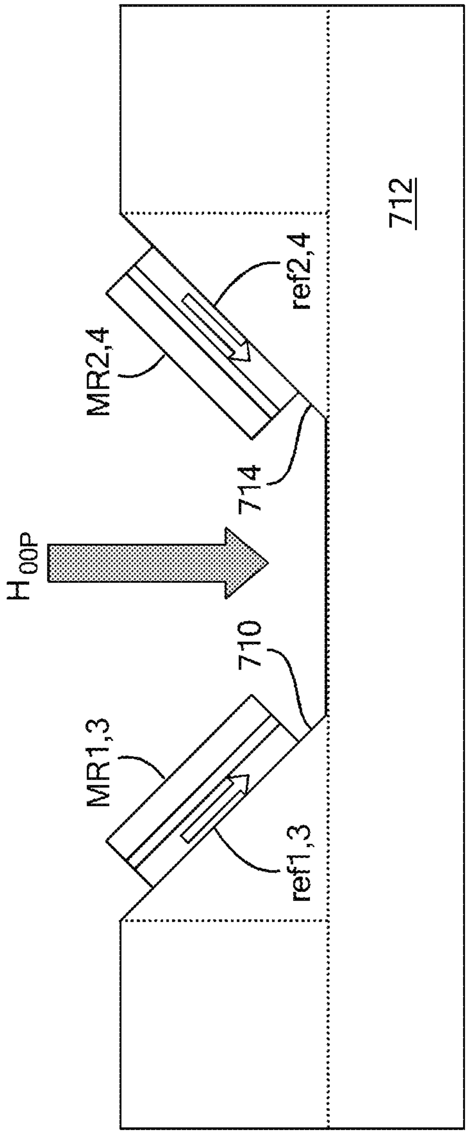
FIG. 7B shows bridge elements on a sloped surfaces of a substrate.
Figure 7C:
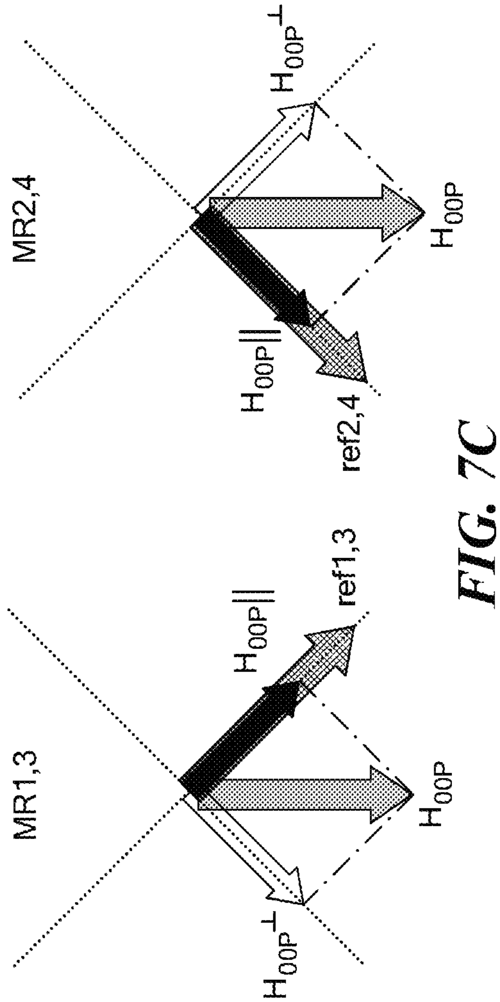
FIG. 7C shows responses of the bridge elements to an out-of-plane field.

FIGS. 7A-C are similar to FIGS. 6A-C but with different reference orientations as indicated by the arrows in the bridge elements. In FIG. 7A, the orientations are the same in the bridge elements and in FIG. 6A the orientations are opposite. The configuration of FIGS. 7A-C shows immunity to an out-of-plane field $H_{OOP}$. FIG. 7B shows elements MR1,3 and elements MR2,4 on oppositely sloped surfaces 710, 714 of the substrate 712. FIG. 7C shows that due to the same direction of the reference layer orientations, ref1,3 and ref2,4 produce a zero output voltage Vout at the output of the bridge due to the immunity of an OOP field.

In example embodiments, trenches, grooves, etc., can be formed in the substrate to provide sloped surfaces at desired locations and angles.

Figure 8C:
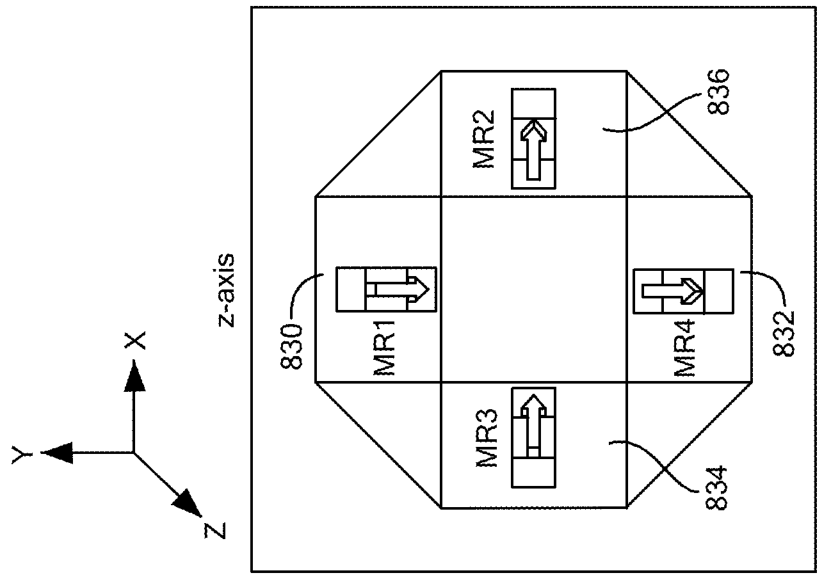
FIG. 8C shows a bridge for z-axis sensitivity.
Figure 8B:
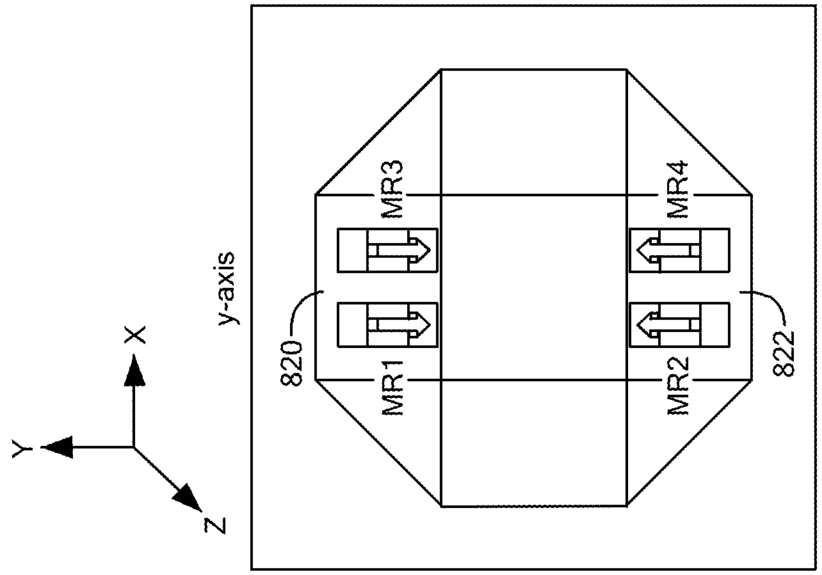
FIG. 8B shows a bridge for y-axis sensitivity.
Figure 8A:
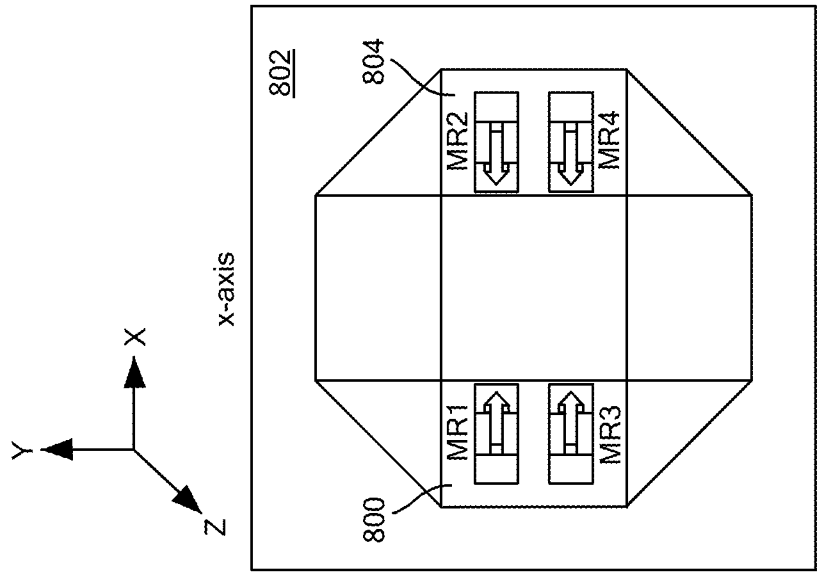
FIG. 8A shows magnetic field sensing elements on a substrate having a bridge for x-axis sensitivity.

FIGS. 8A, 8B, and 8C show an example configuration of MR bridge elements to provide a 3D magnetometer. FIG. 8A shows MR bridge elements MR1, MR3 placed on one sloped surface 800 of a substrate 802 and MR elements MR2, MR4 placed on an opposite sloped surface 804 of the substrate with reference orientations indicated by respective arrows. In the illustrated embodiment, the elements in MR1-4 are configured to provide x-axis sensitivity. FIG. 8B shows elements MR1-4 with reference orientations and positioning on sloped surfaces 820, 822 to provide y-axis sensitivity. FIG. 8C shows MR elements MR1-4 with indicated reference orientations and a substrate having first and second sloped surfaces 830, 832 facing each other and third and fourth sloped surfaces 834, 836 facing each other. A first MR element MR1 is positioned on the first surface 830, the fourth MR element MR4 is positioned on the second surface 832, the third MR element MR3 is positioned on the third surface 834, and the second MR element MR2 is positioned on the fourth surface 836. The MR elements MR1-4 combine to provide z-axis sensitivity. The elements in each of FIGS. 8A-C can be combined to provide a 3D magnetometer.

Figure 8D:
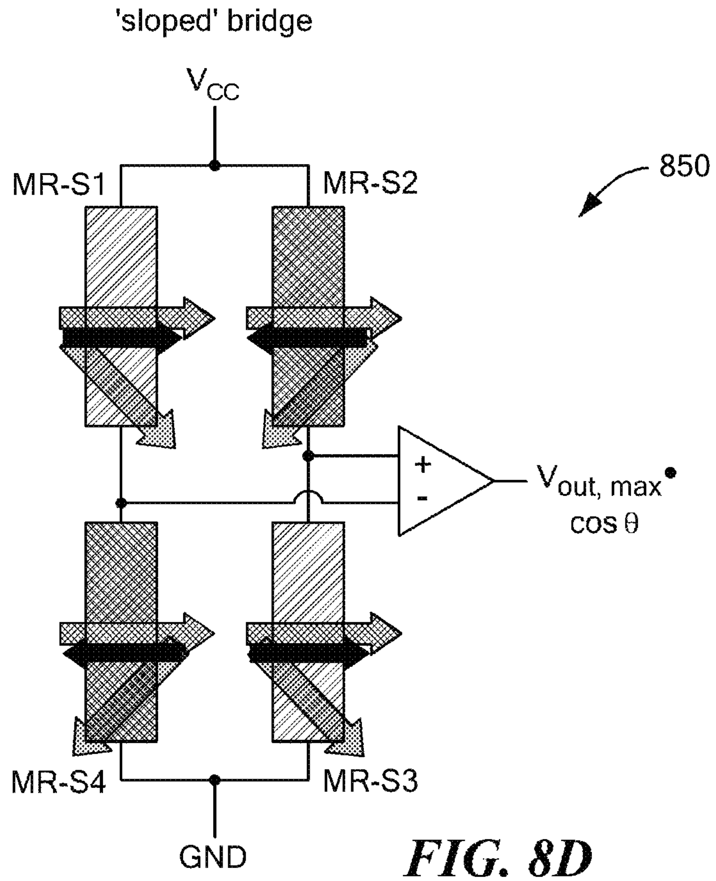
FIG. 8D shows a bridge with sensing elements on a sloped surface.
Figure 8E:
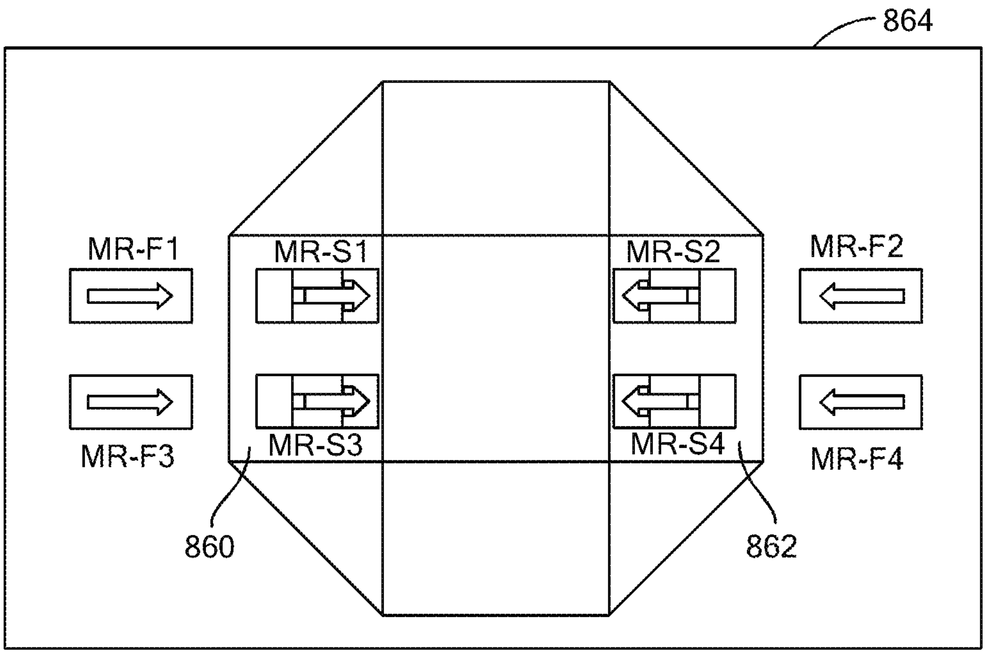
FIG. 8E is a top view.
Figure 8F:
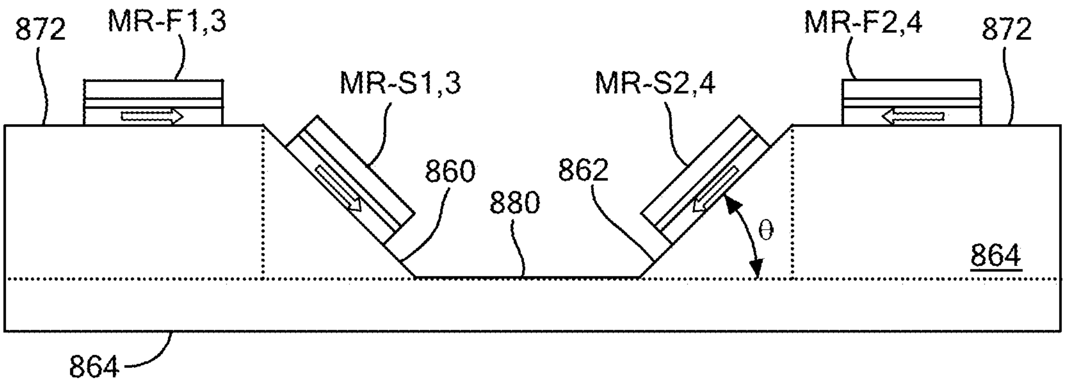
FIG. 8F is a cross-sectional view of the sensing elements on the flat surface and the sloped surfaces of the substrate.
Figure 8G:
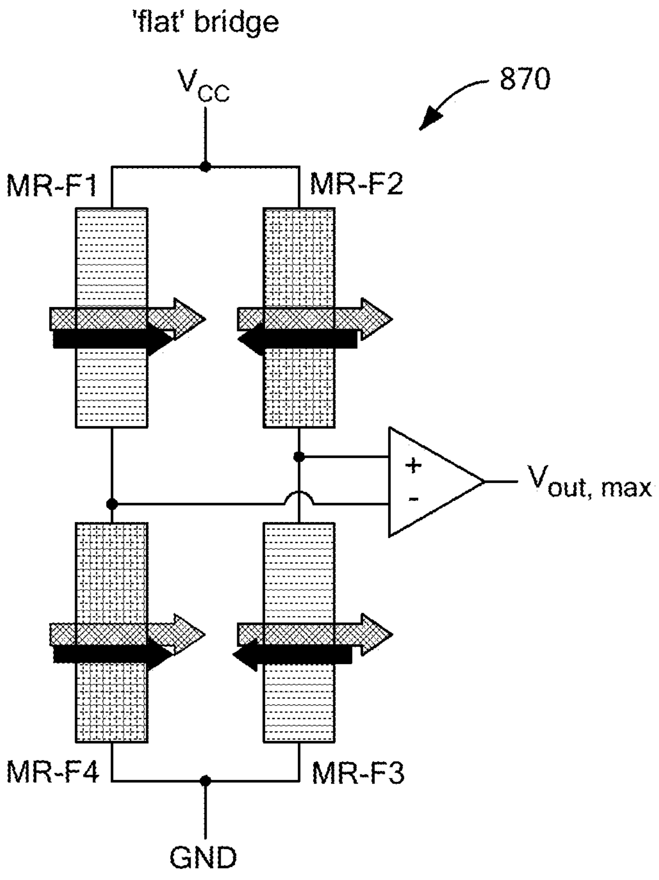
FIG. 8G shows a bridge with sensing elements on flat surface.

FIG. 8D shows a further MR bridge 850 with MR elements MR-S1, MR-S2, MR-S3, MR-S4 located on sloped surfaces 860, 862 of a substrate 864 shown in FIGS. 8E and 8F and FIG. 8G shows an MR bridge 870 with MR elements MR-F1, MR-F2, MR-F3, MR-F4 located on flat surfaces 872 of the substrate, i.e., the major surface of the substrate. The sloped surfaces 860, 862 form an angle θ with respect to horizontal, which corresponds to the major surface of the substrate. The sloped surfaces 860, 862 extend up from a bottom 880 of the trench that forms the sloped surfaces. In embodiments, the bridge elements MR-F1-4 on the flat surface 872 of the substrate 864 experience maximum planar field so as to enable calibration of the planar component of the sloped bridge 850. With this arrangement, variations in the slope angle θ can be corrected.

Figure 9:
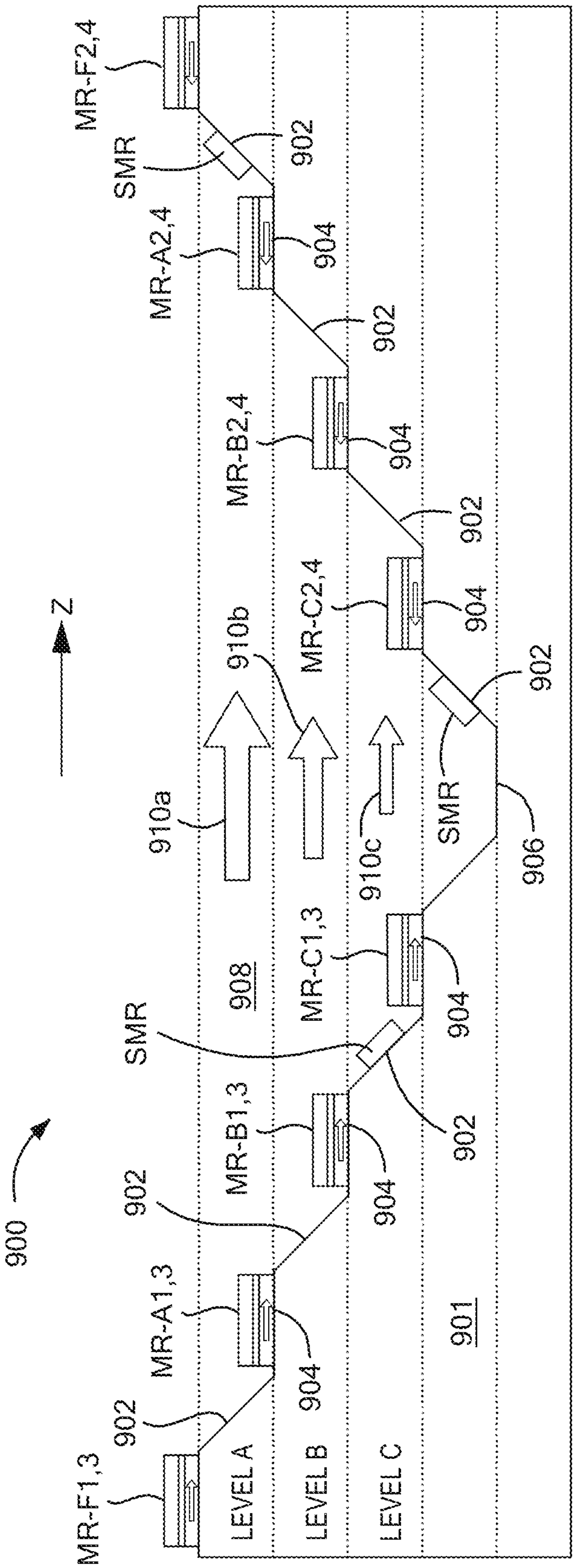
FIG. 9 shows sensing elements at various depths to detect field gradients.

FIG. 9 shows an example sensing element configuration 900 with a substrate 901 having steps 904 formed by a series of sloped surfaces 902 formed in the substrate. MR elements can be placed on the steps 904 where the steps can be formed at varying distances from a bottom surface 906 of a trench 908 formed in the substrate. In the illustrated embodiment, the steps 904 are formed at levels A, B, C with MR elements placed on each step level. By having MR elements at different levels, e.g., heights, field gradients in the z-direction, for example, can be measured. In the illustrated embodiment, a series of arrows 910*a, b, c* have sizes that generally correspond to the strength of an applied field.

In the illustrated embodiment, elements MR-A1,3 are located at level A on an upper step 904 on one slope in the trench 908 and elements MRA2,4 are located at level A on an upper step 904 on the opposing slope in the trench. Similarly, elements MR-B1,3 and elements MR-B2,4 are located on steps 904 on opposing slopes of the trench on level B and elements MR-C1,3 and elements MR-C2,4 are located on steps 904 on opposing slopes of the trench on level C.

It is understood that any practical number of MR elements can be placed on one or more sloped surfaces between steps to meet the needs of a particular application and that any practical number of levels and steps can be used. In addition, the distance between levels can be equal. In other embodiments, the level spacing changes to place the MR elements in a particular shape, e.g., parabolic, hyperbolic, concave, etc., to meet the needs of a particular application.

In embodiments, any practical number of MR elements SMR can be placed on sloped surfaces at various levels to achieve desired response characteristics for the sensor. MR elements MR-F1,3 and MR-F2,4 can be located on the major surface of the substrate proximate edges of the trench.

Figure 10A:
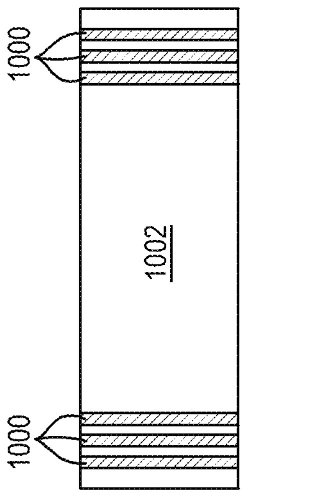
FIGS. 10A-X show processing steps to fabricate a 3D sensor having TMR elements on sloped surfaces of a substrate.
Figure 10B:
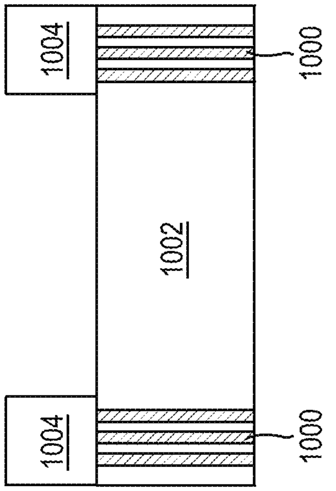
Figure 10C:
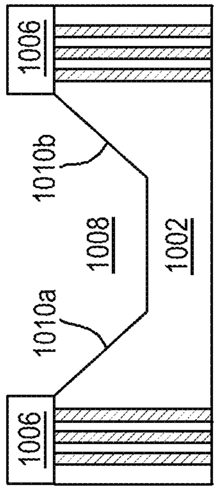
Figure 10D:
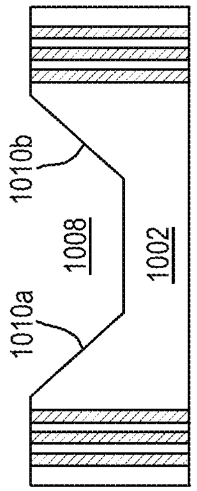
Figure 10E:
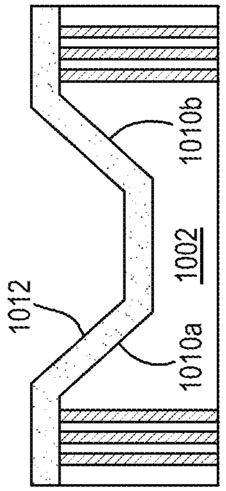
Figure 10F:
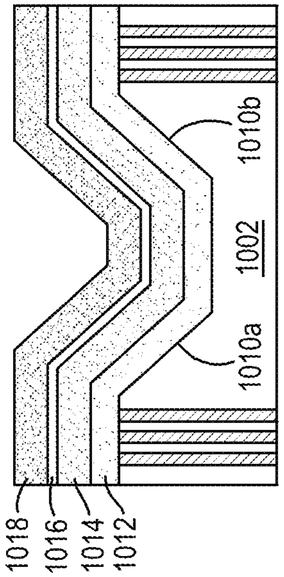
Figure 10G:
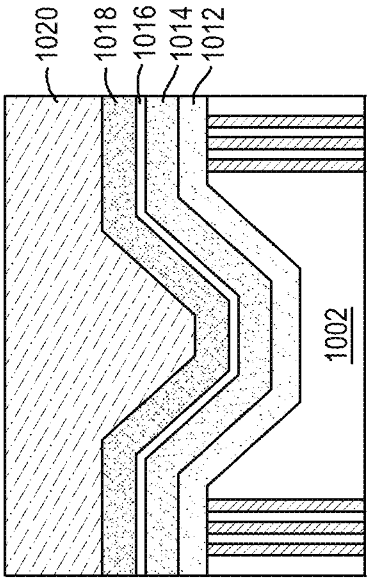
Figure 10H:
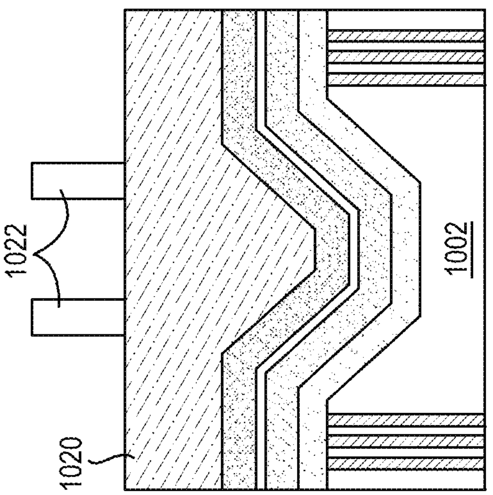
Figure 10I:
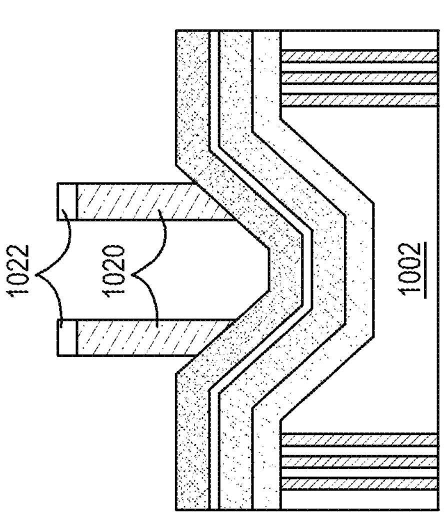
Figure 10J:
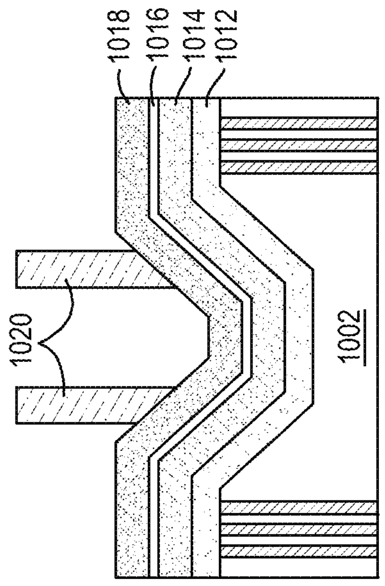
Figure 10K:
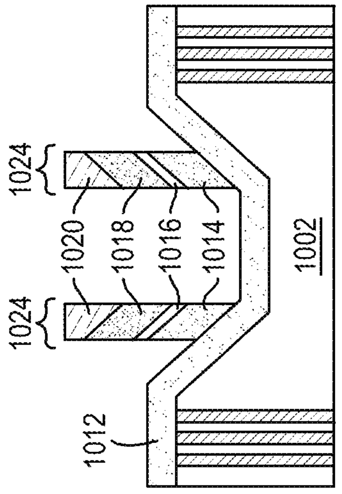
Figure 10L:
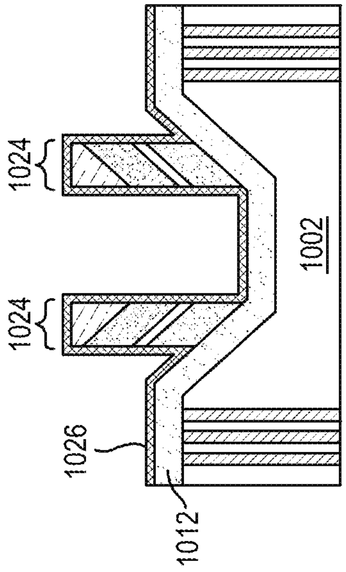
Figure 10M:
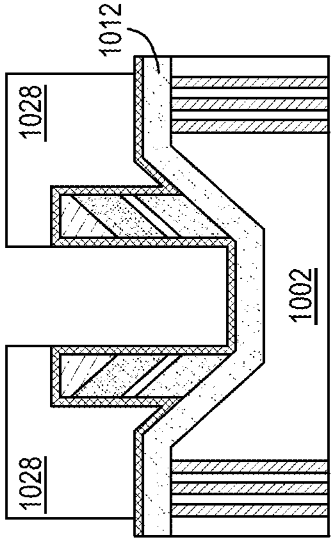
Figure 10N:
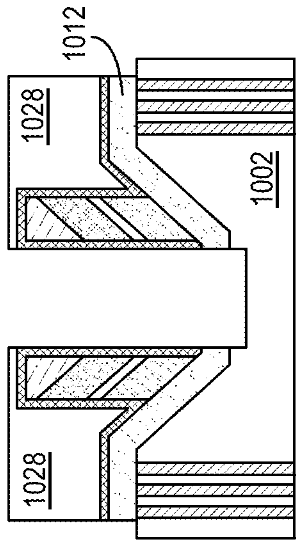
Figure 10O:
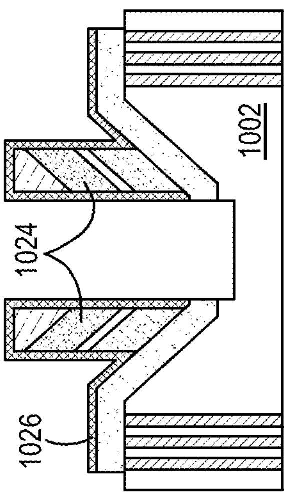
Figure 10P:
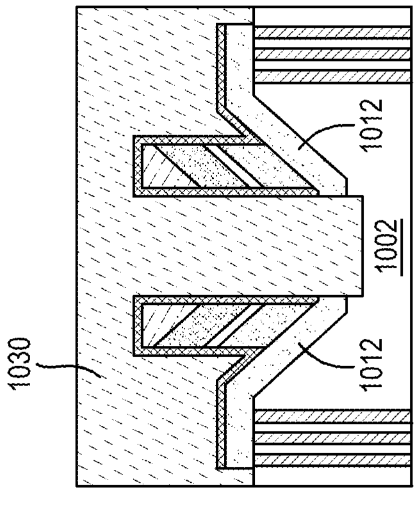
Figure 10Q:
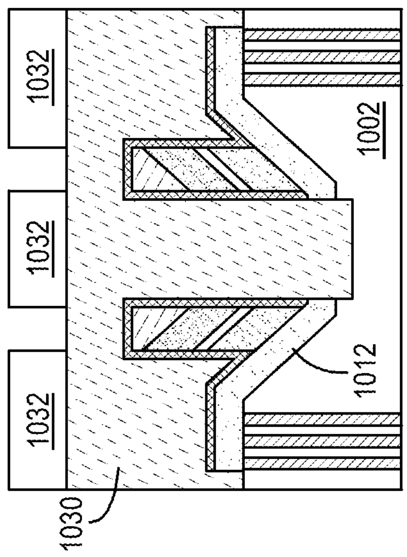
Figure 10R:
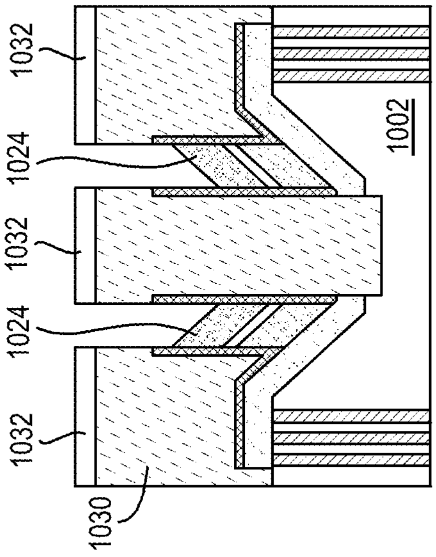
Figure 10S:
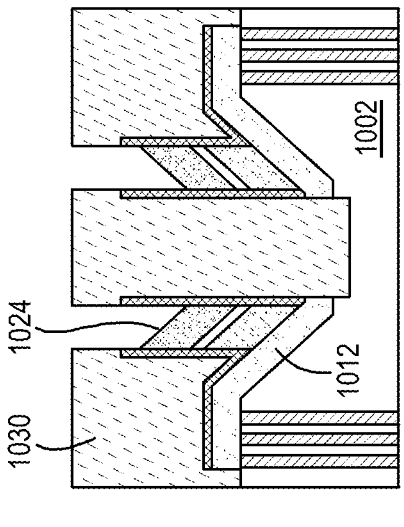
Figure 10T:
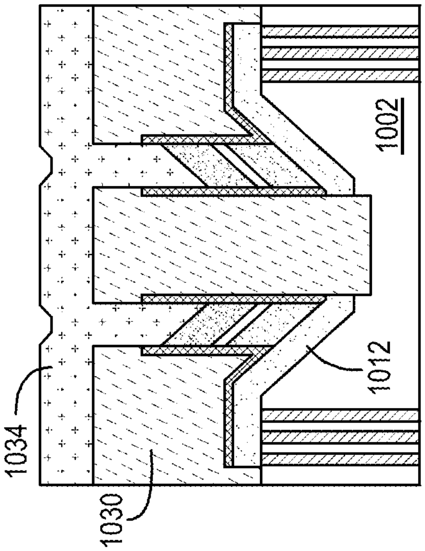
Figure 10U:
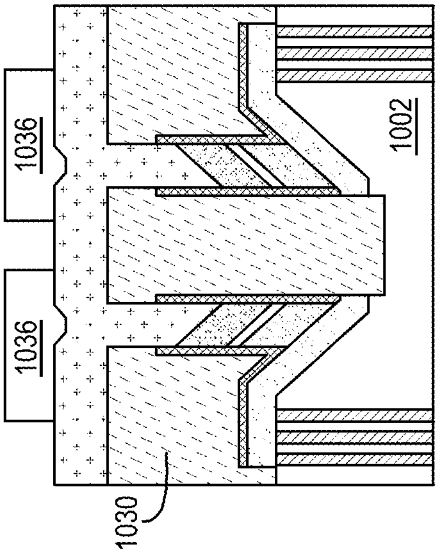
Figure 10V:
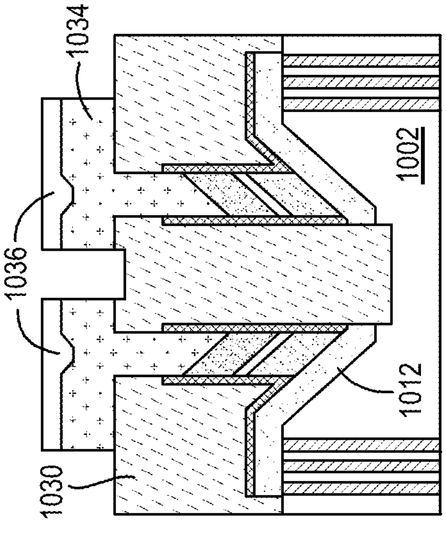
Figure 10W:
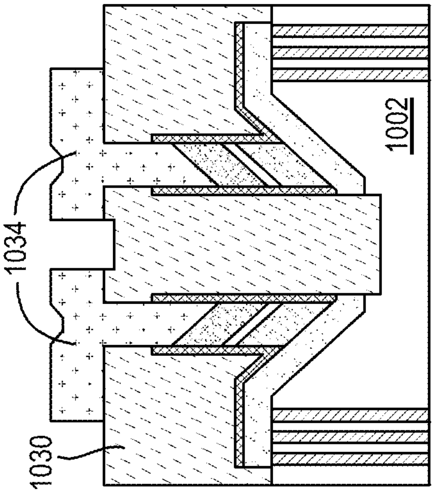
Figure 10X:
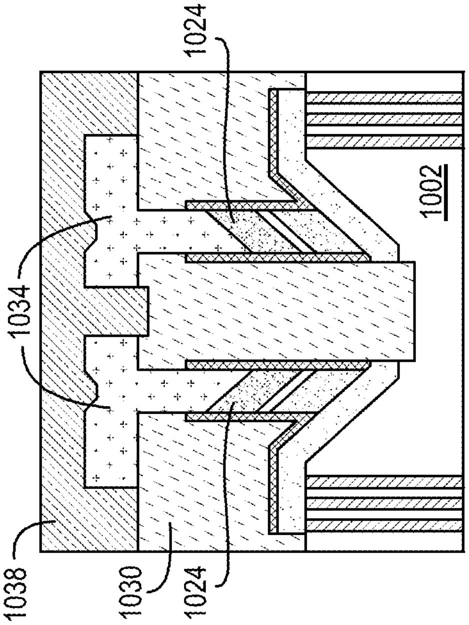

FIGS. 10A-X show an assembly at various process steps of forming a 3D TMR sensor with sensing elements located on sloped surfaces of a substrate. FIG. 10A shows vias 1000 formed in an insulating layer 1002, such as SiO2. FIG. 10B shows photolithography including defining a photoresist (PR) 1004 that will block etching of the slope groove. FIG. 10C shows PR 1006 remaining after oxide etched and a groove 1008 patterned in the insulating layer 1002 to form opposing sloped surfaces 1010*a, b* allowing for TMR element deposit. FIG. 10D shows the photoresist removed and the slope surface profiles completed.

FIG. 10E shows a conductive cushion layer 1012 as a bottom electrode deposit into the slope groove 1008. Example materials for the cushion layer include Al, Cu, and TiN. FIG. 10F shows a TMR element deposit of layers 1014, 1016, 1018 on the cushion layer 1012 for an active TMR stack, wherein layer 1016 is a tunneling barrier layer, such as MgO. FIG. 10G shows a hard layer mask 1020, which may comprise SiO2 for example. FIG. 10H shows a photolithography step used to define photoresist 1022 to block etching of the hard mask 1020 and FIG. 10I shows etching of the photoresist 1022 and the PR 1022 remaining after hard mask etch. In embodiments, a reactive ion etch can be used to etch the SiO2 mask material. FIG. 10J shows that the PR has been stripped. FIG. 10K shows etching of the TMR stack to create pillars 1024 with layers 1014, 1016, 1018 with mask material 1020 on top. In embodiments, a physical etch, such as ion beam etching (IBE) can be is used since the TMR stack contains chemical elements and compounds that may be challenging to etch in a single chemical etch. IBE is well-suited to mill out TMR material unprotected by hard mask 1020. The etching stops at the bottom electrode layer 1012.

FIG. 10L shows a capping layer 1026, such as SiN, deposited to protect TMR pillar sidewalls. FIG. 10M shows a photolithography step for defining a photoresist pattern 1028 for the bottom electrode 1012 patterning. FIG. 10N shows the bottom electrode 1012 patterned by the etching, such as reactive ion and FIG. 10O shows the PR stripped. FIG. 10P shows an insulating layer 1030 deposited to isolate the bottom electrode 1012 and serve as the top contact layer. FIG. 10Q shows a photolithography step defining photoresist 1032 to define the top contact and step 10R shows etching of the top contact 1030 via etching to expose tops of the pillars 1024. FIG. 10S shows the PR 1032 stripped. FIG.

10T shows a conducting material, such as Al, Cu, TiN, deposited as a jumper material 1034 to provide a connection to the TMR pillars 1024 and FIG. 10U shows a photolithography step defining a photoresist pattern 1036 for top electrode jumper material 1034 patterning. FIG. 10V shows etching of the top contact material 1034 patterned and FIG. 10W shows the PR 1036 stripped. FIG. 10X shows a passivation layer 1038 applied to the assembly.

Figure 11:
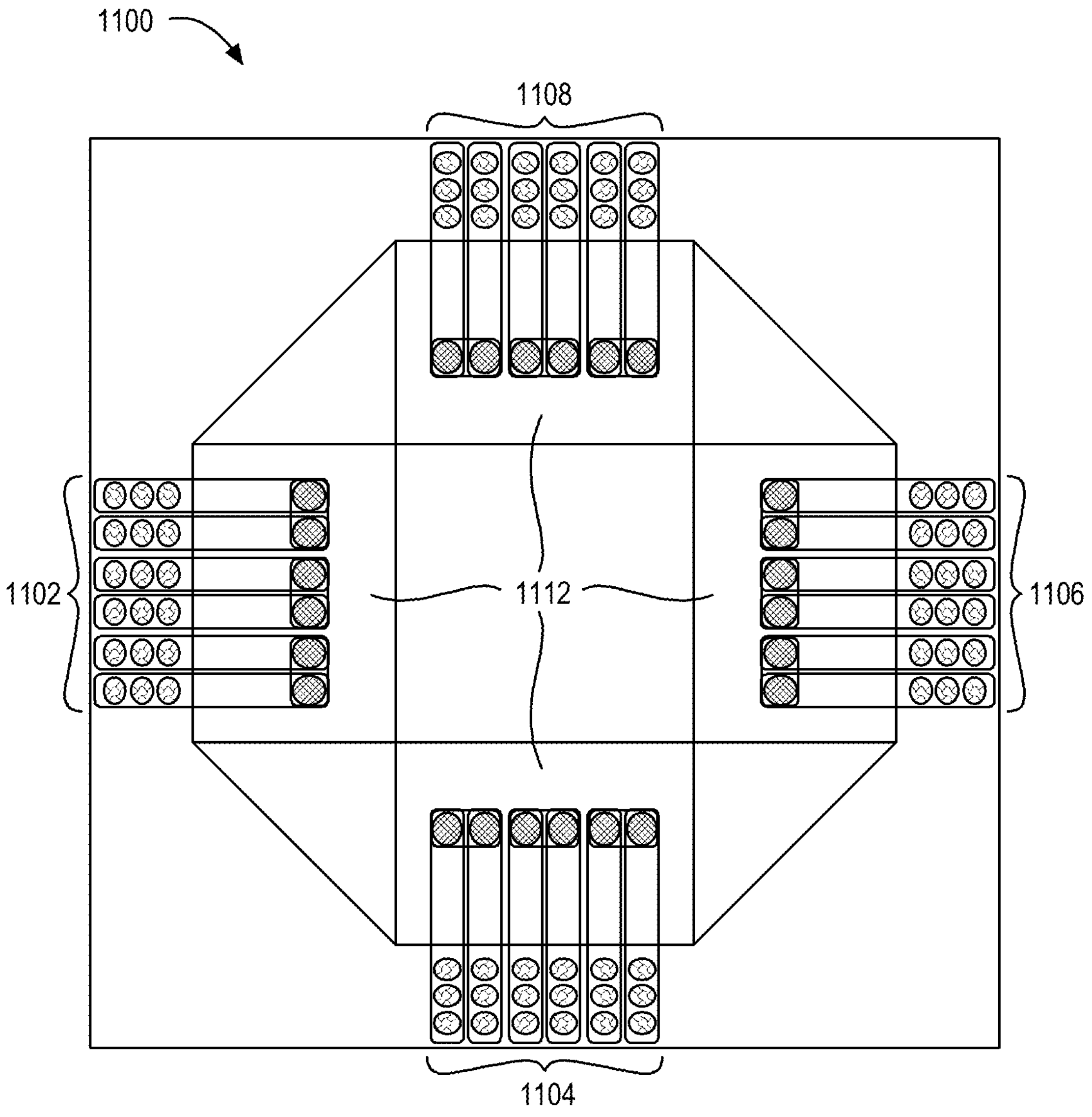
FIG. 11 shows a top view of a TMR sensor fabricated in accordance with steps shown in FIGS. 10A-X.

FIG. 11 shows an example 3D TMR sensor 1100 having groups of TMR elements 1102, 1104, 1106, 1108 having pillars with the TMR elements positioned on a substrate 1110 with respective sloped surfaces 1112, as described above. FIGS. 10A-X show an example series of steps to provide the example 3D TMR sensor 1100 of FIG. 11.

Figures 12A, 12B, 12C, 12D, 12E, 12F:
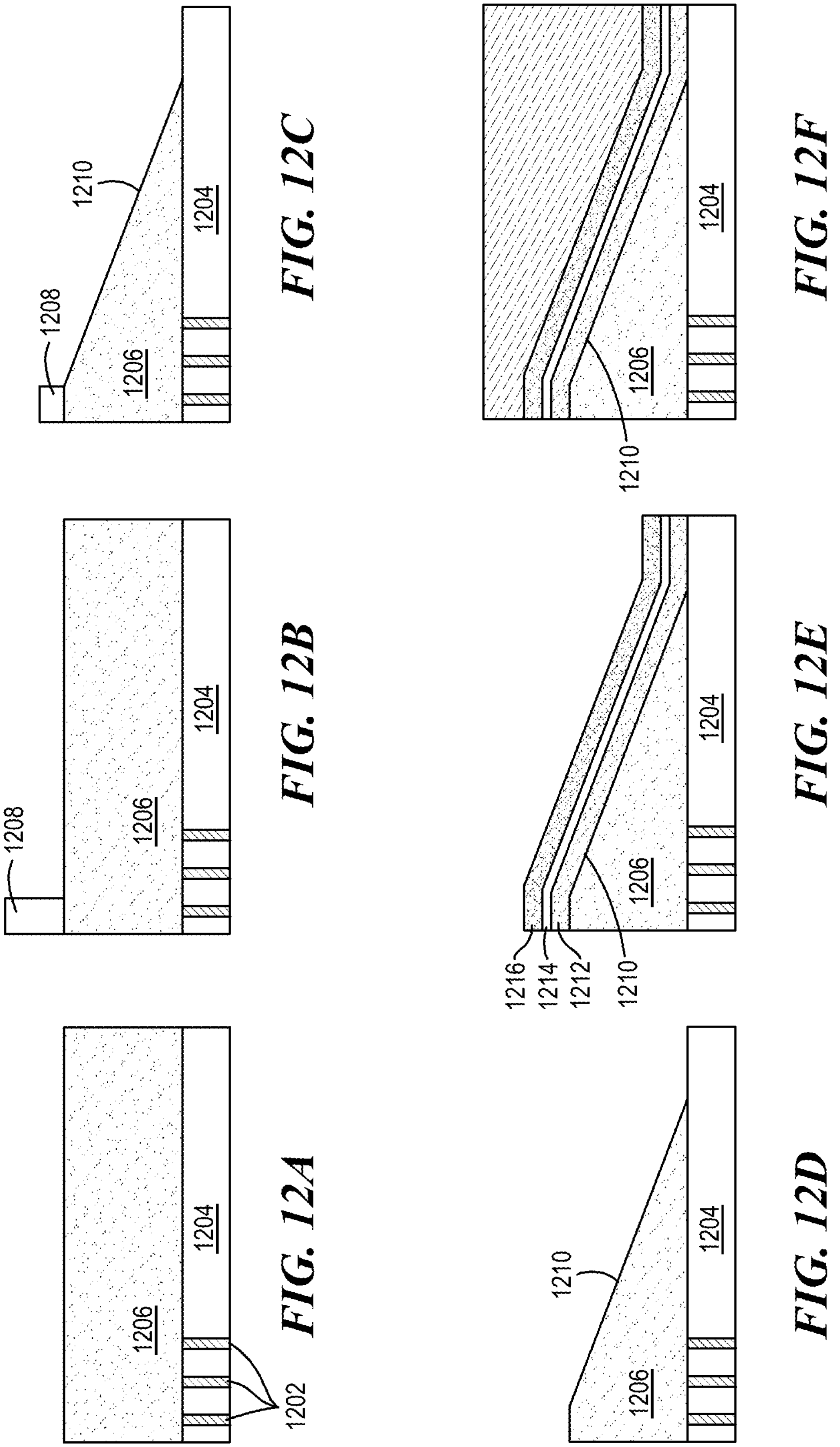
FIGS. 12A-T show processing steps to fabricate a 3D sensor having TMR elements on sloped surfaces of a substrate with a metal bottom contact and tilt etching.
Figure 12I:
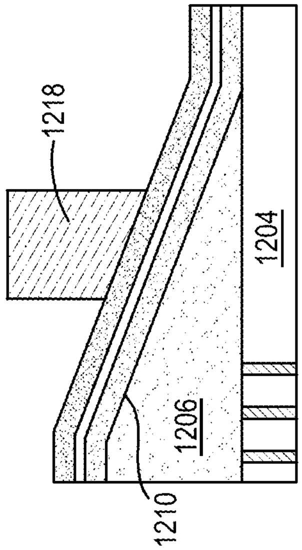
Figure 12H:
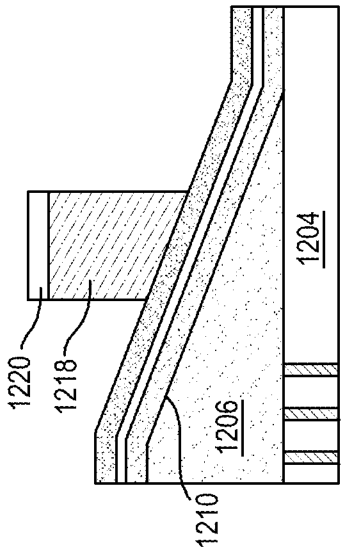
Figure 12G:
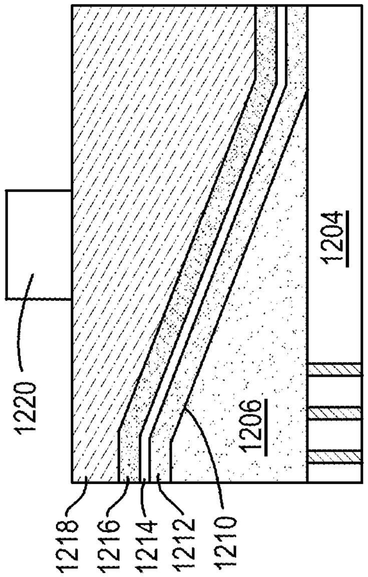

FIG. 12A shows vias 1202 in an insulating layer 1204 and deposited conducting layer 1206, which may comprise Al, Cu, TiN or other suitable material. FIG. 12B shows an example photolithography step for defining photoresist 1208 that will block etching of the slope profile 1210 patterned in the conducting layer 1206 shown in FIG. 12C. FIG. 12D shows the PR stripped to expose the slope profile for TMR deposition. In FIG. 12E, TMR elements 1212, 1214, 1216 are deposited on top of the conducting layer 1206. In FIG. 12F, a hard mask material 1218, such as SiO2, is applied over the TMR layers. FIG. 12G shows a photolithography step to define photoresist 1220 that will block etching of the hard mask. FIG. 12H shows hard mask 1218 etching using the photoresist 1210 as a mask to pattern the hard mask. A reactive ion etch, for example, can be used to etch the $SiO_2$ hard mask material. In step 12I, the photoresist is stripped and hard mask definition is complete.

Figure 12L:
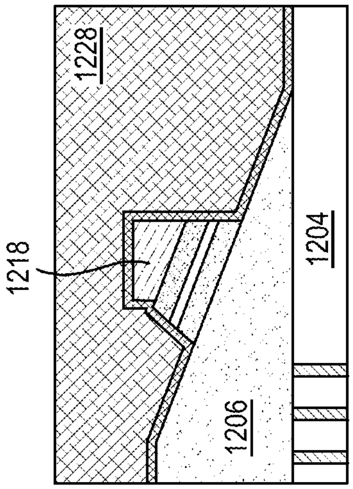
Figure 12K:
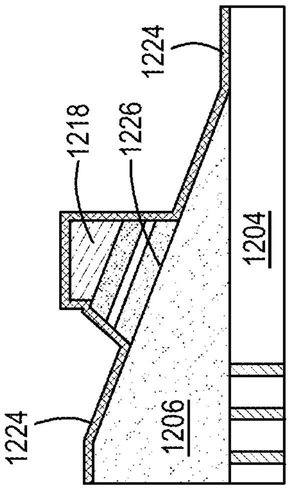
Figure 12J:
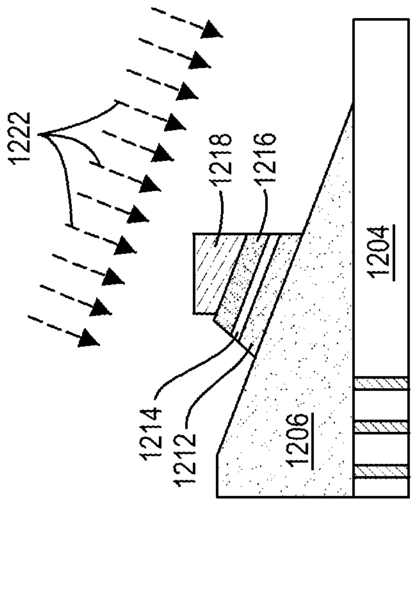

In step 12J, etching of the TMR stack is performed using, for example, ion beam etching (IBE) as the TMR stack contains various chemical elements and compounds not easily etched in a single chemistry. The IBE processing, which is indicated with arrows 1222, allows the substrate/wafer 1204 to tilt at a given angle corresponding to the slope profile. The IBE processing mills out TMR material 1212, 1214, 1216 not protected by hard mask 1218. The etching stop at the bottom electrode layer. FIG. 12K shows a capping layer 1224, such as SiN, deposited to protect sidewalls of the TMR pillar 1226. FIG. 12L shows an insulating layer 1228 deposited to isolate the bottom electrode and serve as the top contact layer.

Figure 12M:
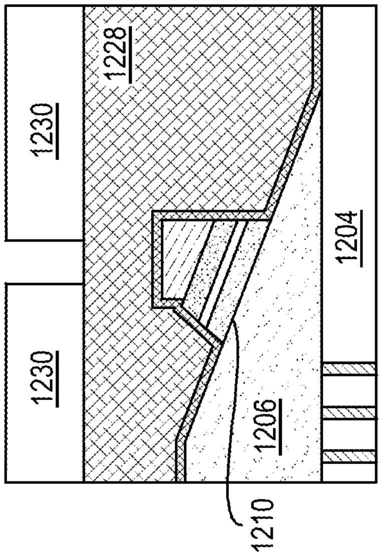
Figure 12N:
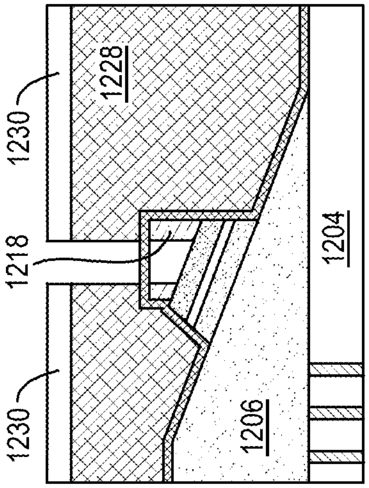
Figure 12O:
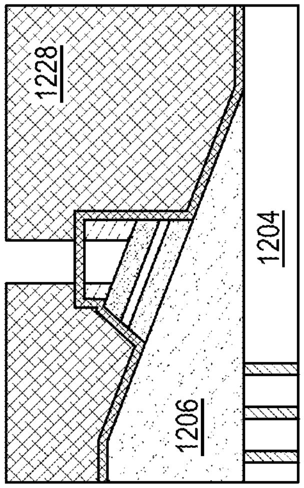
Figure 12P:
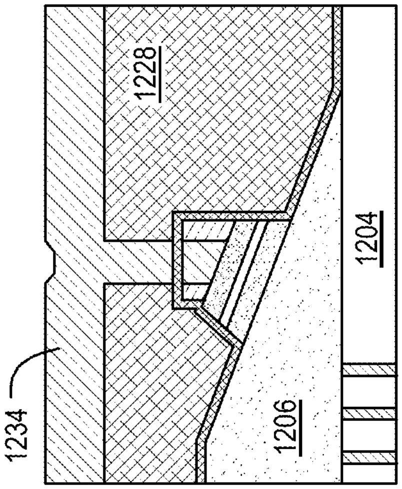
Figure 12Q:
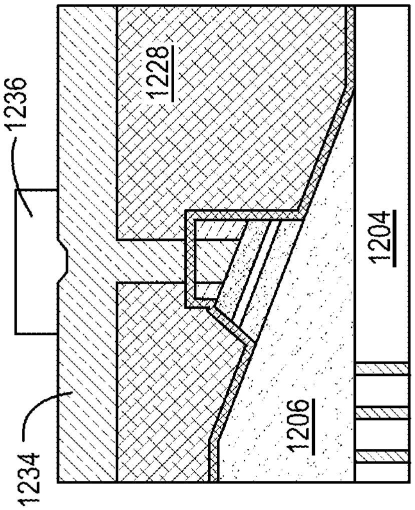
Figure 12R:
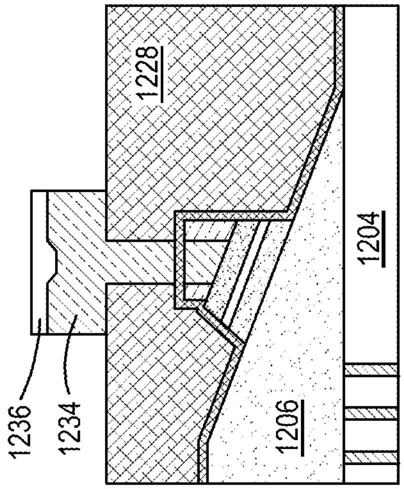
Figure 12T:
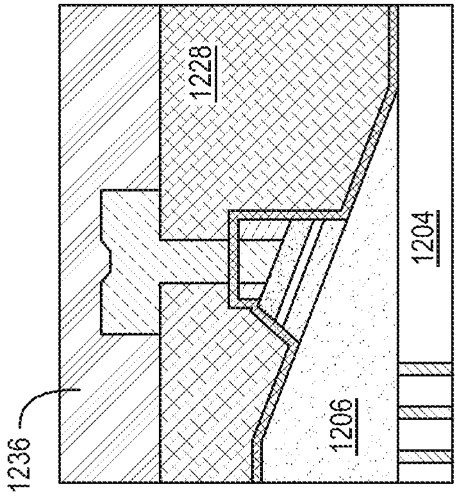
Figure 12S:
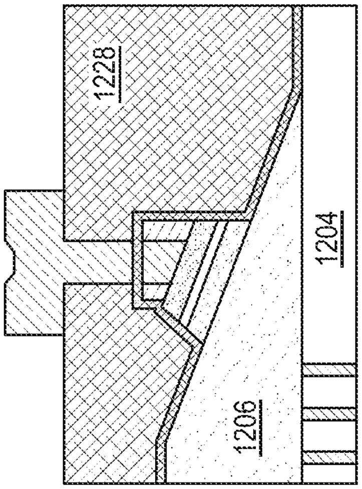

FIG. 12M shows a photolithography step defining photoresist 1230 to define the top contact via and FIG. 12N shows etching for the top contact via etching of the insulating layer 1228 and stop 1218 on top of the TMR element 1226. The photoresist 1230 is stripped in FIG. 12O. FIG. 12P shows conducting material 1232, such as Al, Cu, TiN, deposited as the jumper material 1234 for the TMR pillar connection. FIG. 12Q shows a photolithography step to define photoresist 1236 for the top electrode jumper material 1234 patterning, as shown in FIG. 12R. FIG. 12S shows the photoresist stripped and FIG. 12T shows a passivation layer 1236 capping on top of the structure.

Figure 13A:
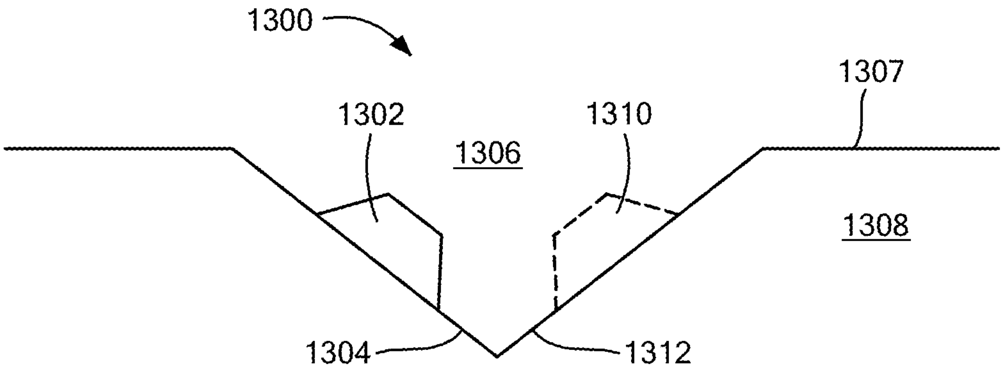
FIG. 13A is a cross-sectional view and FIG. 13B is a top view of an example sensor having Hall effect elements on sloped surfaces of a substrate.
Figure 13B:
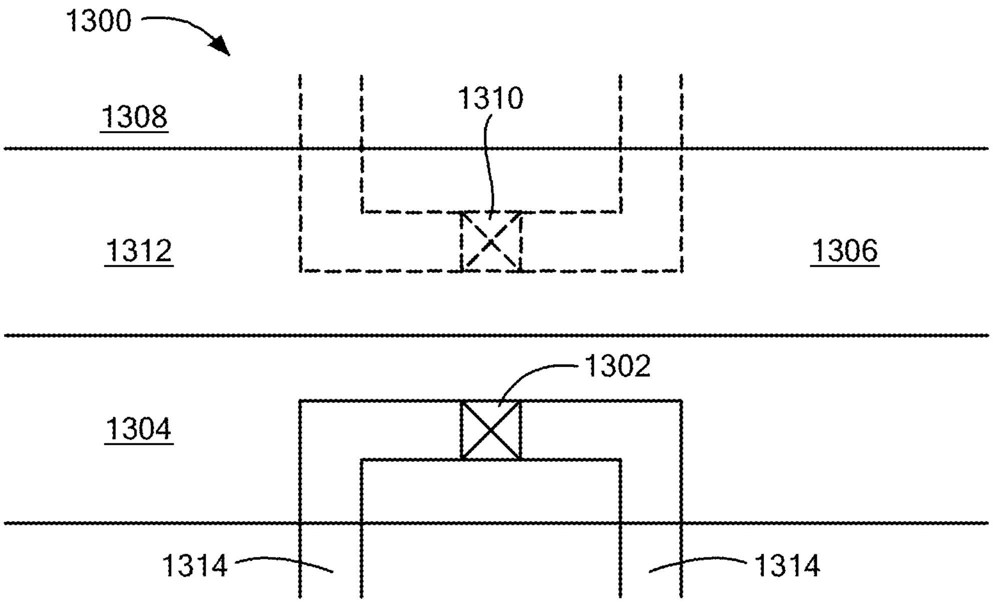

FIG. 13A shows a cross-sectional view and FIG. 13B shows a top view of a portion of an example sensor 1300 having Hall elements 1302 on sloped surfaces 1304 formed by a V-shaped groove 1306 of a substrate 1308 to provide a 3D sensor. An optional further Hall element 1310 can be placed on an opposite sloped surface 1312 as the Hall element 1302.

In embodiments, the groove 1306 is etched in the substrate 1308 to provide the sloped surfaces 1304, 1312. Example etching processes include KOH and/or other anisotropic etchants, such as TMAH. It is understood that such etching processes may result in an angle defined by the silicon crystal lattice angle, which may not be exactly 45 degrees.

Hall element 1302 may be deposited on the sloped surface 1304 to locate the Hall element in a desired position. For example, it may be desirable to form the Hall element 1302 completely within the groove 1306, i.e., lower than the major surface 1307 of the substrate.

Electrical connections 1314 can be coupled to the Hall element 1302 using, for example, metal line on insulator, such as SiO2, Si3N4, for example. Polymer insulators can also be used.

It is understood that example embodiments of the disclosure are applicable to a wide range of sensors, position sensors, applications, and systems in which it is desirable to detect an in/out-of-plane component of a signal of interest. Example applications include MR-based bridges sensitive to the out-of-plane/perpendicular/z-axis component of the field, 3D magnetometers, z-sensor or a 3D magnetometer with an additional bridge to calibrate the slope angle, using multi-level substrates to create a z-axis gradiometer, and the like.

As used herein, the term “magnetic field signal” is used to describe any signal that results from a magnetic field experienced by a magnetic field sensing element. As used herein, the term “magnetic field sensor” or simply “sensor” is used to describe a circuit that uses one or more magnetic field sensing elements, generally in combination with other circuits. The magnetic field sensor can be, for example, a rotation detector, a movement detector, a current sensor, or a proximity detector. A rotation detector can sense rotation of an object, for example, advance and retreat of magnetic domains of a ring magnet or advance and retreat of gear teeth of a ferromagnetic gear. The term “movement detector” can be used to describe either a rotation detector or a magnetic field sensor that can sense different movement, e.g., linear movement, of a ferromagnetic object, for example, linear movement of magnetic domains of a ring magnet or linear movement of gear teeth of a ferromagnetic gear.

Magnetic field sensors are used in a variety of applications, including, but not limited to an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field. The circuits and techniques described herein apply to any magnetic field sensor capable of detecting a magnetic field.

As used herein, the terms “processor” and “controller” are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

It should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A sensor, comprising:
- a substrate having a major surface and opposing sloped surfaces; and
- magnetoresistive (MR) magnetic field sensing elements coupled in a bridge configuration, wherein at least some of the magnetic field sensing elements are located on the sloped surfaces,
- wherein at least some of the magnetic field sensing elements are located at different depths from the major surface of the substrate for detecting field gradients, and
- wherein the at least some of the magnetic field sensing elements located at different depths from the major surface of the substrate are positioned on respective steps formed in the sloped surfaces.

2. The sensor according to claim 1, wherein the sensor comprises a 3D magnetometer.

3. The sensor according to claim 2, wherein the bridge configuration comprises an x-axis bridge, a y-axis bridge, and a z-axis bridge.

4. The sensor according to claim 3, wherein the x-axis bridge includes a first pair of bridge elements on a first one of the opposing sloped surfaces and a second pair of bridge elements on a second one of the opposing sloped surfaces for sensitivity in the x-axis.

5. The sensor according to claim 4, wherein the first and second opposing sloped surfaces have opposite slope angles.

6. The sensor according to claim 4, wherein the y-axis bridge includes a third pair of bridge elements on a third one of the opposing sloped surfaces and a fourth pair of bridge elements on a fourth one of the opposing sloped surfaces for sensitivity in the x-axis, wherein the x-axis and the y-axis are perpendicular to each other.

7. The sensor according to claim 6, wherein the third and fourth opposing sloped surfaces oppose each other and have opposite slope angles.

8. The sensor according to claim 6, wherein the z-axis bridge includes at least four bridge elements each located on different ones of the sloped surfaces for sensitivity in the z-axis.

9. The sensor according to claim 1, further including further magnetic field sensing elements located on a major surface of the substrate.

10. The sensor according to claim 9, wherein the further magnetic field sensing elements are configured to calibrate the magnetic field sensing elements on the sloped surfaces.

11. The sensor according to claim 1, wherein first ones of the at least some of the magnetic field sensing elements are located on the sloped surfaces.

12. The sensor according to claim 1, wherein second ones of the at least some of the magnetic field sensing elements are located on the steps which are parallel to the major surface of the substrate.

13. The sensor according to claim 1, wherein the magnetic field sensing elements comprise tunnelling magnetoresistive (TMR) elements.

14. The sensor according to claim 1, further including Hall elements deposited on at least one of the sloped surfaces.

15. The sensor according to claim 14, wherein the sloped surfaces having the deposited Hall elements are formed by a v-shaped etch.

16. The sensor according to claim 14, wherein the sloped surfaces having the deposited Hall elements are extend from a flat bottom surface.

17. The sensor according to claim 15, wherein the angle of the sloped surfaces having the deposited Hall elements formed by the v-shaped etch corresponds to a crystal lattice angle of the substrate.

18. A method, comprising:
- manipulating a substrate, which forms part of a sensor, to have a major surface and opposing sloped surfaces; and
- coupling magnetoresistive (MR) magnetic field sensing elements in a bridge configuration, wherein at least some of the magnetic field sensing elements are located on the sloped surfaces,
- wherein at least some of the magnetic field sensing elements are located at different depths from the major surface of the substrate for detecting field gradients, and
- wherein the at least some of the magnetic field sensing elements located at different depths from the major surface of the substrate are positioned on respective steps formed in the sloped surfaces.

19. The method according to claim 18, wherein the sensor comprises a 3D magnetometer.

20. The method according to claim 19, wherein the bridge configuration comprises an x-axis bridge, a y-axis bridge, and a z-axis bridge.

21. The method according to claim 20, wherein the x-axis bridge includes a first pair of bridge elements on a first one of the opposing sloped surfaces and a second pair of bridge elements on a second one of the opposing sloped surfaces for sensitivity in the x-axis.

22. The method according to claim 21, wherein the first and second opposing sloped surfaces have opposite slope angles.

23. The method according to claim 21, wherein the y-axis bridge includes a third pair of bridge elements on a third one of the opposing sloped surfaces and a fourth pair of bridge elements on a fourth one of the opposing sloped surfaces for sensitivity in the x-axis, wherein the x-axis and the y-axis are perpendicular to each other.

24. The method according to claim 23, wherein the third and fourth opposing sloped surfaces oppose each other and have opposite slope angles.

25. The method according to claim 23, wherein the z-axis bridge includes at least four bridge elements each located on different ones of the sloped surfaces for sensitivity in the z-axis.

26. The method according to claim 18, further including employing further magnetic field sensing elements located on a major surface of the substrate.

27. The method according to claim 26, wherein the further magnetic field sensing elements are configured to calibrate the magnetic field sensing elements on the sloped surfaces.

28. The method according to claim 18, wherein first ones of the at least some of the magnetic field sensing elements are located on the sloped surfaces.

29. The method according to claim 18, wherein second ones of the at least some of the magnetic field sensing elements are located on the steps which are parallel to the major surface of the substrate.

30. The method according to claim 18, wherein the magnetic field sensing elements comprise tunnelling magnetoresistive (TMR) elements.

31. The method according to claim 18, further including Hall elements deposited on at least one of the sloped surfaces.

32. The method according to claim 31, wherein the sloped surfaces having the deposited Hall elements are formed by a v-shaped etch.

33. The method according to claim 31, wherein the sloped surfaces having the deposited Hall elements are extend from a flat bottom surface.

34. The method according to claim 32, wherein the angle of the sloped surfaces having the deposited Hall elements formed by the v-shaped etch corresponds to a crystal lattice angle of the substrate.

* * * * *